(12) United States Patent
Laporte

(10) Patent No.: US 8,890,609 B2
(45) Date of Patent: Nov. 18, 2014

(54) SYSTEMS AND METHODS FOR BAND-LIMITED ADAPTATION FOR PA LINEARIZATION

(71) Applicant: Telefonaktiebolaget L M Ericsson (publ), Stockholm (SE)

(72) Inventor: Pierre-Andre Laporte, Gatineau (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 63 days.

(21) Appl. No.: 13/681,976

(22) Filed: Nov. 20, 2012

(65) Prior Publication Data

US 2014/0139286 A1    May 22, 2014

(51) Int. Cl.
  *H03F 1/26*   (2006.01)
  *H03F 1/32*   (2006.01)
  *H03F 3/24*   (2006.01)

(52) U.S. Cl.
  CPC ........ *H03F 1/3258* (2013.01); *H03F 2200/111* (2013.01); *H03F 1/3247* (2013.01); *H03F 3/24* (2013.01)
  USPC .......................................................... 330/149

(58) Field of Classification Search
  CPC .............................. H03F 1/3241; H03F 1/3252
  USPC ........................................ 330/149; 455/114.3
  See application file for complete search history.

(56) References Cited

U.S. PATENT DOCUMENTS

| 8,380,144 | B1 | 2/2013 | Bai et al. | |
| 8,536,943 | B2 * | 9/2013 | Irvine | 330/149 |
| 2012/0128099 | A1 | 5/2012 | Morris et al. | |
| 2013/0077713 | A1 * | 3/2013 | Kim et al. | 375/297 |

OTHER PUBLICATIONS

Bassam, S. et al., "2-D Digital Predistortion (2-D-DPD) Architecture for Concurrent Dual-Band Transmitters", IEEE Transactions on Microwave Theory and Techniques, Oct. 2011, vol. 59, No. 10, pp. 2547-2553, Calgary, Canada.
Cidronali, A. et al., "A New Approach for Concurrent Dual-Band IF Digital PreDistortion: System Design and Analysis", Integrated Nonlinear Microwave and Millimetre-Wave Circuits, Nov. 2008, pp. 127-130, Florence, Italy.
Bassam, S. et al., "Channel-Selective Multi-Cell Digital Predistorter for Multi-Carrier Transmitters," IEEE Transactions on Communications, vol. 60, No. 8, Aug. 2012, 9 pages.
Choi, Sungho et al., "Design of Digital Predistorters for Wideband Power Amplifiers in Communication Systems with Dynamic Spectrum Allocation," 2011 IEEE International Conference on Acoustics, Speech and Signal Processing, May 22, 2011, Prague, Czech Republic, 4 pages.
International Search Report and Written Opinion for PCT/IB2013/060282 mailed Jan. 24, 2014, 14 pages.

* cited by examiner

*Primary Examiner* — Steven J Mottola
(74) *Attorney, Agent, or Firm* — Withrow & Terranova, PLLC

(57) ABSTRACT

Systems and methods are disclosed for providing band-limited power amplifier linearization. In one embodiment, a system includes a power amplifier configured to amplify a power amplifier input signal to provide a power amplifier output signal and a digital predistortion system configured to compensate for up to a predefined maximum order of non-linearity of the power amplifier. The digital predistortion system includes a band-limited adaptation subsystem. As compared to conventional adaptation subsystems, the band-limited adaptation subsystem is significantly less complex and consumes less power.

21 Claims, 17 Drawing Sheets

SYSTEMS AND METHODS FOR BAND-LIMITED ADAPTATION FOR PA LINEARIZATION

FIELD OF THE DISCLOSURE

The present disclosure relates to a digital predistortion system that compensates for non-linearities of a power amplifier and more particularly relates to a digital predistortion system that compensates for non-linearities of a power amplifier where the digital predistortion system includes a band-limited adaptation subsystem.

BACKGROUND

The design of radio frequency power amplifiers for communication applications often involves a trade-off between linearity and efficiency. Typically, power amplifiers (PAs) are most efficient when operated at or near saturation. However, the response of the power amplifier at or near the point of saturation is non-linear. As such, generally speaking, an output response of a power amplifier is non-linear and exhibits memory effects when the power amplifier is operating in the power amplifier's high-efficiency range.

One way to improve the efficiency and overall linearity of a power amplifier is to digitally predistort the input to the power amplifier to compensate for the distortion introduced by the power amplifier. In effect, the input signal is adjusted in anticipation of the distortion to be introduced by the power amplifier such that the output signal of the power amplifier is substantially free of distortion products. Generally, digital predistortion is applied to the input signal at baseband frequencies, i.e., before the input signal is up-converted to a desired radio frequency.

To illustrate, a power amplifier may exhibit first and third order effects characterized by a polynomial function of the input that may be written for third order non-linearities as:

$$y = f_{NL\text{-}IM\,3}(x) = a_1 x + a_3 x^3 \qquad (1)$$

where x is the input signal and the coefficient $a_3$ is much smaller than $a_1$. The function $f_{NL\text{-}IM3}$ is the response of the power amplifier to the input x and the subscript NL-IM3 denotes non-linearity up to order three. To compensate for the distortion introduced by the power amplifier, a predistorter may have a response that is a polynomial function of the input:

$$z = f_{PD\text{-}IM\,3}(x) = b_1 x + b_3 x^3 \qquad (2)$$

where again x is the input signal and the function $f_{PD\text{-}IM3}$ is the response of the predistorter to the input x.

Substituting Equation (2) into Equation (1) leads to:

$$y = f_{NL\text{-}IM\,3}(f_{PD\text{-}IM\,3}(x)) = a_1 b_1 x + (a_1 b_3 + a_3 b_1^3) x^3 + O(x^5) \qquad (3)$$

where $O(x^5)$ are terms of fifth-order or higher. By appropriate selection of the coefficients $b_1$ and $b_3$, the third order term may be removed at the expense of creating higher order terms of significantly smaller magnitude. The solution to achieve this is given by:

$$b_3 = \frac{-a_3 b_1^3}{a_1}. \qquad (4)$$

Without loss of generality, assuming that $a_1 = b_1 = 1$, then the solution to compensate for third-order non-linearities is:

$$b_3 = -a_3. \qquad (5)$$

This simple illustration is for third-order non-linearities. For higher order non-linearities (e.g., fifth-order non-linearities), the same approach may be taken to cancel the higher-order terms.

FIG. 1 illustrates a conventional system 10 that implements this digital predistortion approach to compensate for non-linearities of a power amplifier 12. A baseband (BB) source 14 outputs a baseband signal, which is up-sampled by up-sampling circuitry 16 in provision for bandwidth expansion that occurs inside a predistorter (PD) 18. The predistorter 18 predistorts the up-sampled baseband input signal to provide a predistorted baseband input signal. The predistortion, or non-linearities, introduced by the predistorter 18 compensates for the non-linearities of the power amplifier 12. The predistorted baseband signal is then upconverted to a desired carrier frequency ($\omega_C$) and then quadrature modulated by an upconverter 20 and quadrature modulator 22, respectively. The upconverted and quadrature modulated predistorted input signal is then converted from digital to analog by a digital-to-analog converter (DAC) 24 to thereby provide a power amplifier input signal. The power amplifier input signal is then amplified by the power amplifier 12. Again, the predistortion introduced by the predistorter 18 compensates, or effectively cancels, the distortion caused by non-linearities of the power amplifier 12.

The power amplifier output signal is fed back into an observation receiver 26. As illustrated, the observation receiver 26 includes a wideband filter 30, an attenuator 32, downconversion and demodulation circuitry 34, and an analog-to-digital converter (ADC) 36 arranged as shown. The output of the observation receiver 26 is referred to herein as an observation signal ($S_O$). An adaptor 28 then adaptively configures the predistorter 18 based on a comparison of time-aligned as well as gain and phase adjusted versions of the observation signal ($S_O$) and a reference signal ($S_R$), which in this case is the up-sampled input signal input into the predistorter 18. Specifically, the adaptor 28 configures the coefficients of the predistorter 18 based on the comparison of the time-aligned as well as gain and phase adjusted versions of the observation signal ($S_O$) and the reference signal ($S_R$). Notably, together, the predistorter 18, the observation receiver 26, and the adaptor 28 are referred to herein as a digital predistortion (DPD) system 38 whereas the observation receiver 26 and the adaptor 28 are referred to herein as an adaptation subsystem 40 of the digital predistortion system 38.

One issue with the digital predistortion system 38 is that the non-linearities of the power amplifier 12 result in bandwidth expansion which in turn results in increased sampling rate requirements for the predistorter 18 and the adaptor 28. More specifically, as illustrated in FIG. 2, the reference signal ($S_R$) has a bandwidth (B). In contrast, as a result of both predistortion and the non-linearities of the power amplifier 12, the observation signal ($S_O$) suffers from bandwidth expansion. The bandwidth expansion is equal to $N_{MAX\_ORDER}$ times B, where $N_{MAX\_ORDER}$ is the maximum order of non-linearities of the power amplifier 12 for which the digital pre-distortion subsystem 38 is designed to compensate. Specifically, as illustrated in FIG. 3, fifth-order non-linearities, for example, cause the spectrum of the observation signal ($S_O$) to occupy five times the bandwidth (B) of the reference signal ($S_R$). Thus, when compensating for up to fifth-order non-linearities of the power amplifier 12, the digital predistortion system 38, and in particular the adaptation subsystem 40, is designed to support a bandwidth of five times the bandwidth (B) of the reference signal ($S_R$) (i.e., 5×B). In other words, the wideband filter 30 is designed such that a bandwidth of the pass-band of the wideband filter 30 is five times the bandwidth (B) of the reference signal ($S_R$). When compensating for up to fifth-order non-linearities, the sampling rate of the adaptor 28 is therefore greater than five times the bandwidth (B) of the reference signal ($S_R$).

As the need for bandwidth increases in wireless communications systems (e.g., cellular communications networks), the digital predistortion system 38, and in particular the adaptation subsystem 40, must support a much larger bandwidth. These very large bandwidths are challenging for hardware implementations. Further, even if hardware can be designed to support these wide bandwidths, the resulting hardware requires a significant amount of resources and power. As such, there is a need for an adaptation subsystem for a digital predistortion system that minimizes, or substantially reduces, resource and/or power requirements.

SUMMARY

Systems and methods are disclosed for providing band-limited power amplifier linearization. In one embodiment, a system includes a power amplifier configured to amplify a power amplifier input signal to provide a power amplifier output signal and a digital predistortion system configured to compensate for up to a predefined maximum order of non-linearity of the power amplifier. The digital predistortion system includes a band-limited adaptation subsystem. As compared to conventional adaptation subsystems, the band-limited adaptation subsystem is significantly less complex and consumes less power.

In one embodiment, the power amplifier output signal is a single-band signal, and the band-limited adaptation subsystem observes a bandwidth that is less than $N_{MAX\_ORDER}$ times a desired bandwidth of the power amplifier output signal, where $N_{MAX\_ORDER}$ is the predefined maximum order of non-linearity of the power amplifier for which the digital predistortion system compensates. Further, in one preferred embodiment, the bandwidth observed by the band-limited adaptation subsystem is in a range of and including 1.5 to 2 times the desired bandwidth of the power amplifier output signal. The predefined maximum order of non-linearity of the power amplifier for which the digital predistortion system compensates is preferably greater than or equal to third-order such that the digital predistortion system compensates for up to at least the third-order non-linearities of the power amplifier. In another embodiment, the predefined maximum order of non-linearity of the power amplifier for which the digital predistortion system compensates is preferably greater than or equal to fifth-order such that the digital predistortion system compensates for up to at least the fifth-order non-linearities of the power amplifier.

In another embodiment, the power amplifier output signal is a concurrent multi-band signal having multiple frequency bands and, for each frequency band of the power amplifier output signal, the band-limited adaptation subsystem observes a bandwidth that is less than $N_{MAX\_ORDER}$ times a desired bandwidth of the frequency band, wherein $N_{MAX\_ORDER}$ is the predefined maximum order of non-linearity of the power amplifier for which the digital predistortion system compensates. Further, in one preferred embodiment, for each frequency band of the power amplifier output signal, the bandwidth observed by the band-limited adaptation subsystem is in a range of and including 1.5 to 2 times the desired bandwidth of the frequency band. The predefined maximum order of non-linearity of the power amplifier for which the digital predistortion system compensates is preferably greater than or equal to third-order such that the digital predistortion system compensates for up to at least the third-order non-linearities of the power amplifier. In another embodiment, the predefined maximum order of non-linearity of the power amplifier for which the digital predistortion system compensates is preferably greater than or equal to fifth-order such that the digital predistortion system compensates for up to at least the fifth-order non-linearities of the power amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 15:
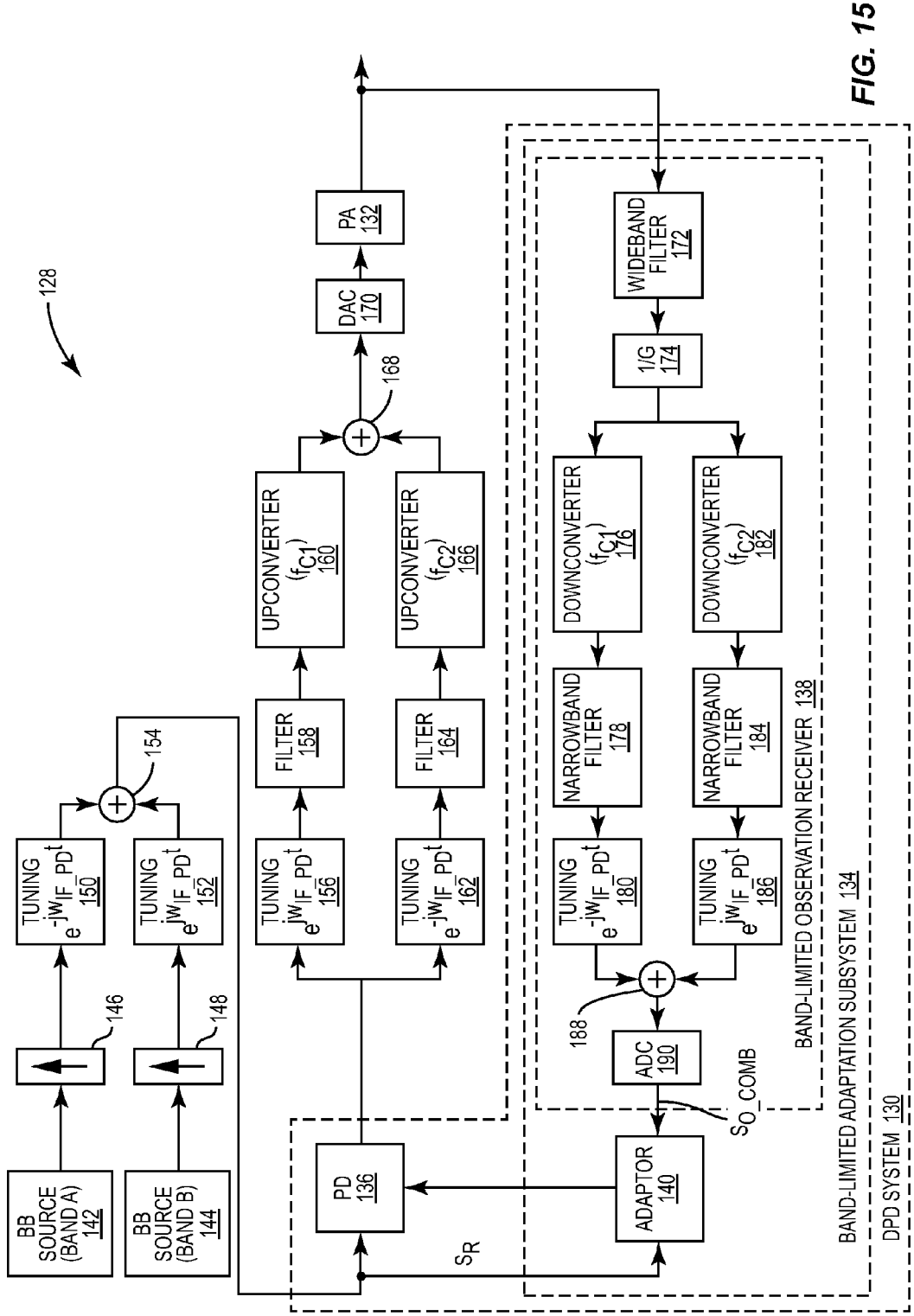
FIG. 15 illustrates a concurrent dual-band transmitter including a digital predistortion system that compensates for non-linearities of a power amplifier of the concurrent dual-band transmitter wherein the digital predistortion system includes a band-limited adaptation subsystem according to another embodiment of the present disclosure.
Figure 17:
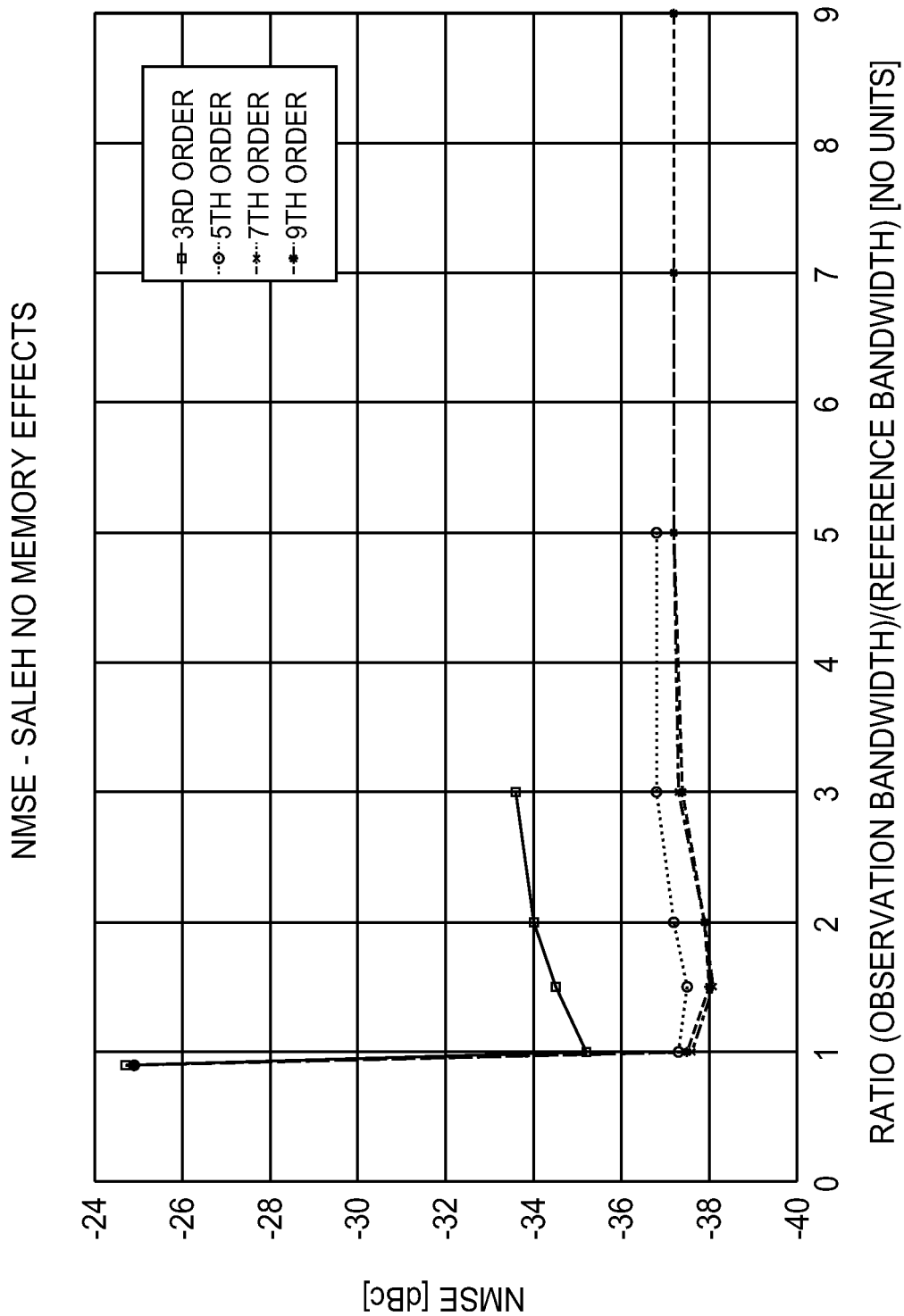
Figure 18:
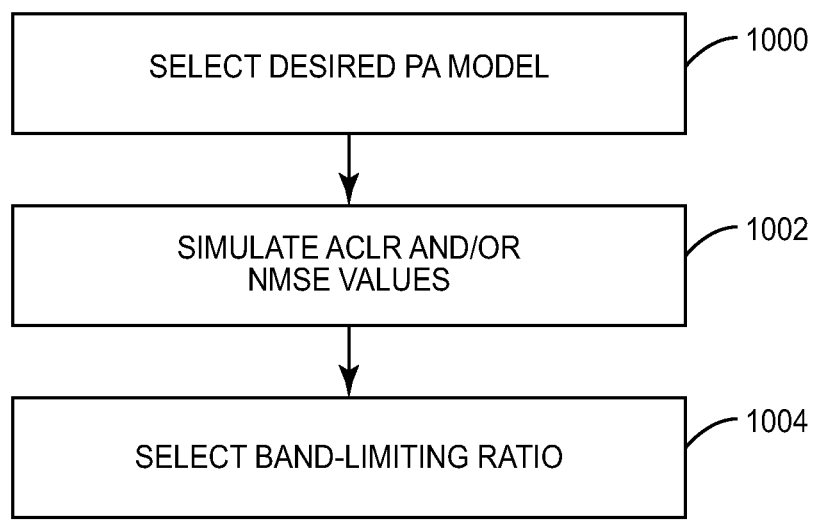

FIG. 17 illustrates results of a simulation of NMSE versus a ratio of a bandwidth of the observation signal over a bandwidth of the reference signal for one embodiment of the concurrent dual-band transmitter of FIG. 15; and FIG. 18 is a flow chart that illustrates a process for selecting a band-limiting ratio for a band-limited adaptation subsystem of a digital predistortion system according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 4:
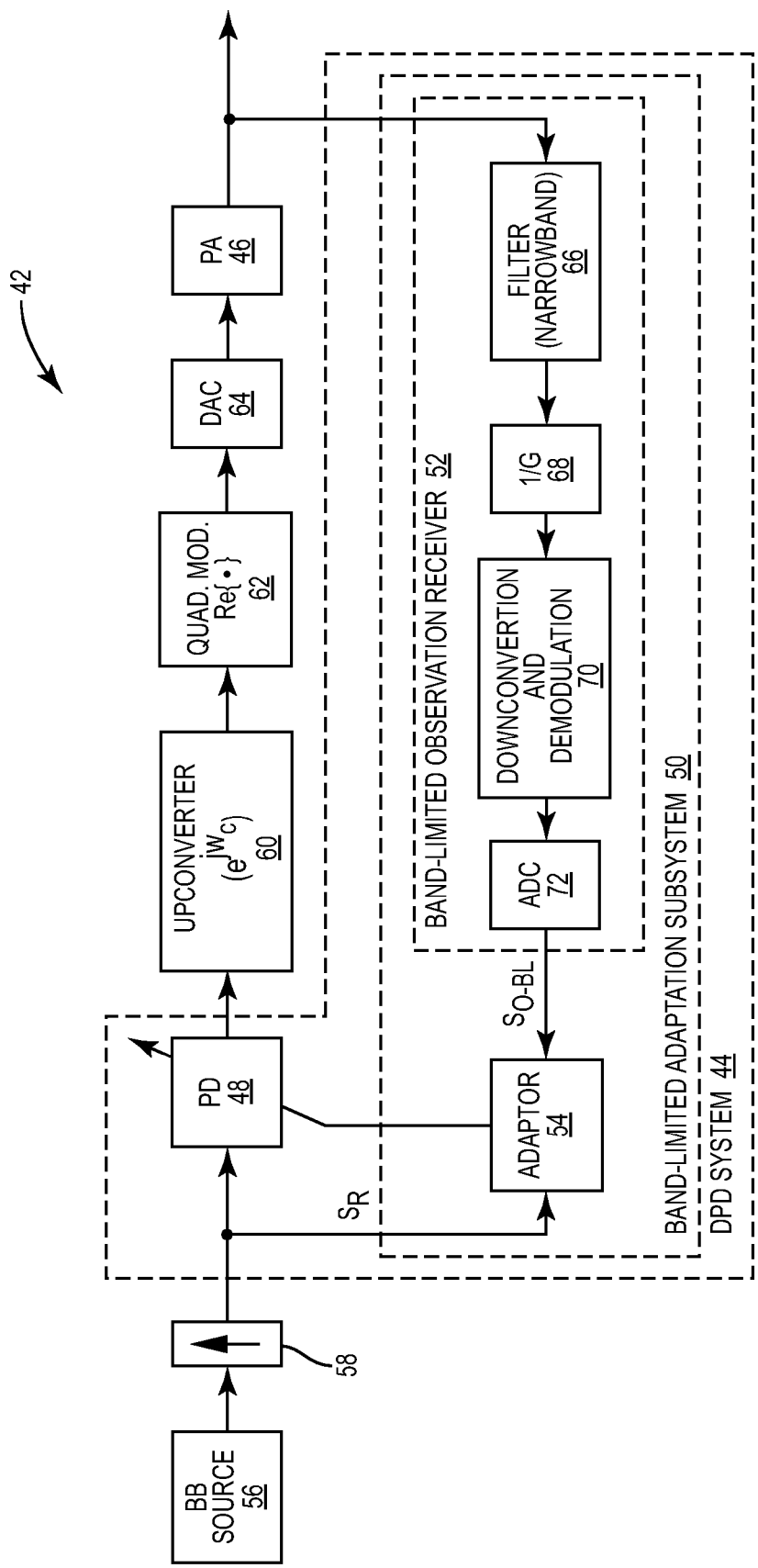
FIG. 4 illustrates a transmitter including a digital predistortion system that compensates for non-linearities of a power amplifier of the transmitter wherein the digital predistortion system includes a band-limited adaptation subsystem according to one embodiment of the present disclosure.

Systems and methods are disclosed for providing band-limited power amplifier linearization. In this regard, FIG. 4 illustrates a system 42 including a digital predistortion (DPD) system 44 that compensates for non-linearities of a power amplifier (PA) 46 according to one embodiment of the present disclosure. As illustrated, the digital predistortion system 44 includes a predistorter (PD) 48 and a band-limited adaptation subsystem 50, where the band-limited adaptation subsystem 50 includes a band-limited observation receiver 52 and an adaptor 54 arranged as shown. As discussed below in detail, the band-limited observation receiver 52 includes a band-limiting function such that a bandwidth observed by the band-limited observation receiver 52, and thus the band-limited adaptation subsystem 50, is less than $N_{MAX\_ORDER}$ times a bandwidth of an input signal to the predistorter 48, where $N_{MAX\_ORDER}$ is a maximum order of non-linearity of the power amplifier 46 for which the digital predistortion system 44 is designed to compensate. The bandwidth observed by the band-limited observation receiver 52 is also referred to herein as the bandwidth supported by the band-limited adaptation subsystem 50 as well as the bandwidth supported by the band-limited observation receiver 52. Notably, the bandwidth of the input signal to the predistorter 48 is also a desired bandwidth of a power amplifier output signal output by the power amplifier 46. In one preferred embodiment, the bandwidth observed by the band-limited observation receiver 52, and thus the band-limited adaptation subsystem 50, is in a range of and including 1.5 to 2 times the bandwidth of the input signal to the predistorter 48 (i.e., the bandwidth of reference signal ($S_R$) and thus the desired bandwidth of the power amplifier output signal).

In operation, a baseband (BB) source 56 generates a baseband input signal, which is up-sampled by up-sampling circuitry 58 to a desired sampling rate. In order to accommodate frequency expansion resulting from predistortion introduced by the predistorter 48 and the non-linearity of the power amplifier 46, the desired sampling rate is greater than $N_{MAX\_ORDER} \times B$, where B is a bandwidth of the baseband input signal. The bandwidth B is also a bandwidth of the reference signal ($S_R$) and a desired bandwidth of a power amplifier output signal output by the power amplifier 46.

The predistorter 48 predistorts the up-sampled baseband input signal to provide a predistorted baseband input signal. The predistortion introduced by the predistorter 48 compensates for up to the maximum order of non-linearity of the power amplifier 46 for which the digital predistortion system 44 is designed to compensate ($N_{MAX\_ORDER}$). The maximum order of non-linearity of the power amplifier 46 for which the digital predistortion system 44 is designed to compensate is at least the third-order. In one preferred embodiment, the maximum order of non-linearity of the power amplifier 46 for which the digital predistortion system 44 is designed to compensate is the fifth-order.

The predistorted baseband input signal is then upconverted and quadrature modulated by an upconverter 60 and a quadrature modulator 62, respectively. The resulting upconverted, modulated, and predistorted input signal is then converted from digital to analog by a digital-to-analog converter (DAC) 64 to thereby provide a power amplifier input signal. Notably, while the DAC 64 is illustrated as being between the quadrature modulator 62 and the power amplifier 46 in this embodiment, the location of the DAC 64 may vary depending on the particular implementation. The power amplifier 46 amplifies the power amplifier input signal to provide the power amplifier output signal.

The power amplifier output signal is fed back into the band-limited observation receiver 52. As discussed below, the band-limited adaptation subsystem 50, and in particular the band-limited observation receiver 52, introduces a band-limiting function that significantly reduces an observation bandwidth of the band-limited observation receiver 52 and thus a sampling rate requirement of the adaptor 54. Specifically, the bandwidth observed by the band-limited observation receiver 52 is denoted as $B_{LIMITED}$. The bandwidth ($B_{LIMITED}$) observed by the band-limited observation receiver 52 is less than $N_{MAX\_ORDER} \times B$ and, in one preferred embodiment, is in a range of and including 1.5 to 2 times B. Since $B_{LIMITED}$ is less than $N_{MAX\_ORDER} \times B$, the sampling rate requirement for the adaptor 54 is reduced from greater than $N_{MAX\_ORDER} \times B$ for the conventional digital predistortion system 10 (FIG. 1) to greater than $B_{LIMITED}$. For example, for fifth-order predistortion and a bandwidth (B) of 40 megahertz (MHz), the sampling rate requirement for the adaptor 54 is reduced from 200 MHz to less than 200 MHz and, in one preferred embodiment, 60 MHz to 80 MHz.

As illustrated, the band-limited observation receiver 52 includes a narrowband filter 66, an attenuator 68, downconversion and demodulation circuitry 70, and an analog-to-digital converter (ADC) 72 arranged as shown. The output of the band-limited observation receiver 52 is referred to herein as a band-limited observation signal ($S_{O\text{-}BL}$). In this embodiment, the narrowband filter 66 serves as the band-limiting function of the band-limited observation receiver 52. The narrowband filter 66 has a pass-band that includes the desired frequency band of the power amplifier output signal (e.g., centered at the carrier frequency of the power amplifier output signal), and a bandwidth of the pass-band of the narrowband filter 66 is less than $N_{MAX\_ORDER}$ times the desired bandwidth of the power amplifier output signal (i.e., less than $N_{MAX\_ORDER}\text{xB}$). In one preferred embodiment, the bandwidth of the pass-band of the narrowband filter 66 is less than two times, and more preferably in a range of and including 1.5 to 2 times, the desired bandwidth of the power amplifier output signal, where $N_{MAX\_ORDER}$ is greater than or equal to 3 or more preferably greater than or equal to 5. As a result of the narrowband filter 66, the bandwidth ($B_{LIMITED}$) observed by the band-limited observation receiver 52 is significantly less than the bandwidth observed by the conventional observation receiver 26 described above with respect to FIG. 1. By reducing the observed bandwidth, the adaptor 54 and the ADC 72 are enabled to run at significantly lower sampling rates.

In operation, the narrowband filter 66 filters the power amplifier output signal to provide a filtered signal. The filtered signal is attenuated by a factor G by the attenuator 68, where G is a gain of the power amplifier 46. The attenuated signal is then downconverted and demodulated by the downconversion and demodulation circuitry 70. The demodulated and downconverted signal is then analog-to-digital converted by the ADC 72 to thereby provide the band-limited observation signal ($S_{O\text{-}BL}$). Notably, while the ADC 72 is illustrated in this embodiment as being between the downconversion and demodulation circuitry 70 and the adaptor 54, the location of the ADC 72 can vary depending on the particular implementation.

The adaptor 54 adaptively configures the predistorter 48 based on a comparison of time-aligned as well as gain and phase adjusted versions of the band-limited observation signal ($S_{O\text{-}BL}$) and the reference signal ($S_R$), which in this case is the up-sampled baseband input signal that is input into the predistorter 48. Specifically, the adaptor 54 configures one or more parameters of the predistorter 48 (e.g., one or more coefficients of a polynomial predistortion function) based on the comparison of the time-aligned as well as gain and phase adjusted versions of the band-limited observation signal ($S_{O\text{-}BL}$) and the reference signal ($S_R$) using any suitable adaptation technique. Notably, while the narrowband filter 66 serves as the band-limiting function of the band-limited observation receiver 52 in the embodiment of FIG. 4, the present disclosure is not limited thereto. For example, the band-limiting function of the band-limited observation receiver 52 may alternatively be implemented at baseband (e.g., a narrowband filter at baseband either before or after the ADC 72).

Figure 5:
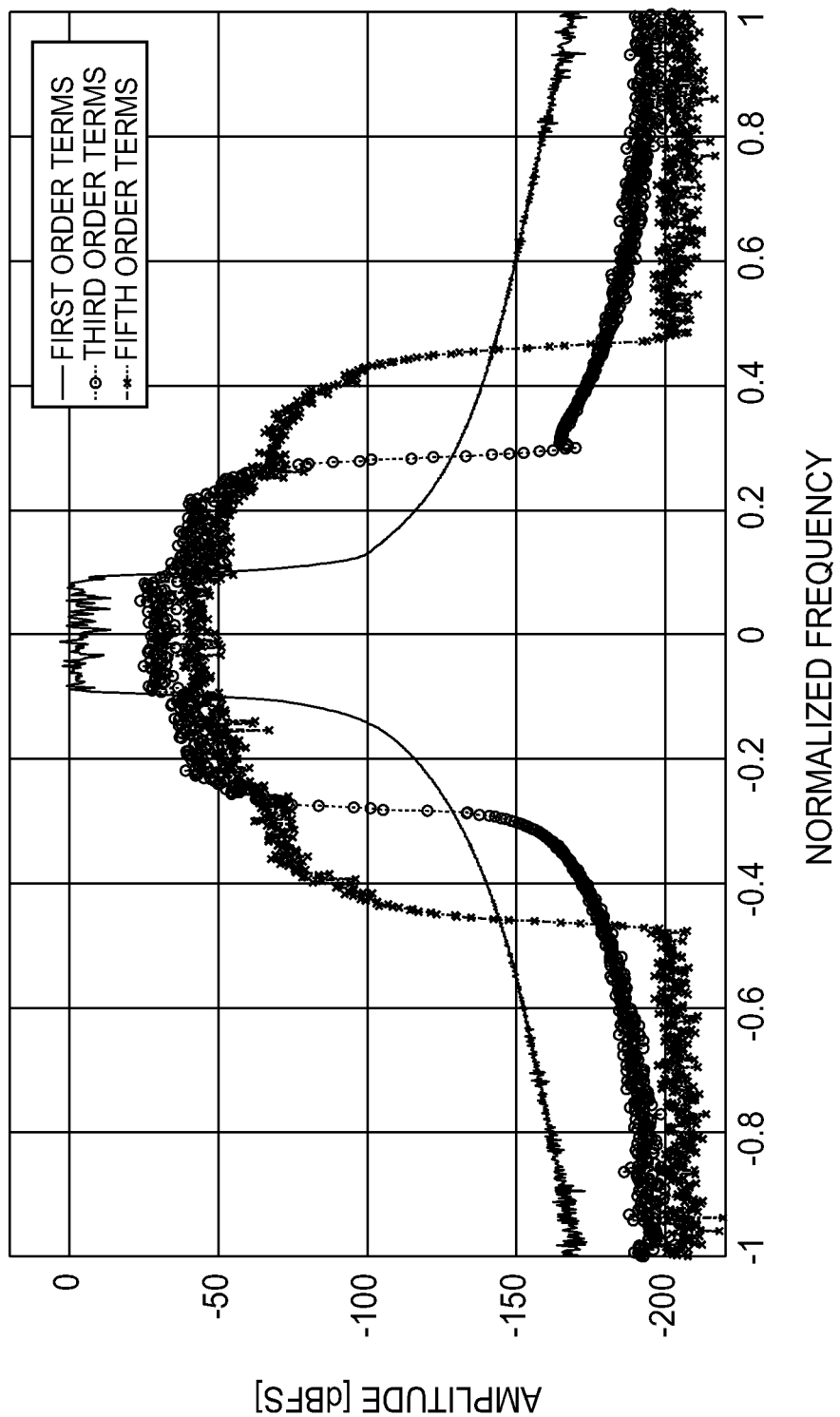
FIG. 5 illustrates simulation results that serve as an example of the contribution from different non-linear terms in the power amplifier output signal.
Figure 6:
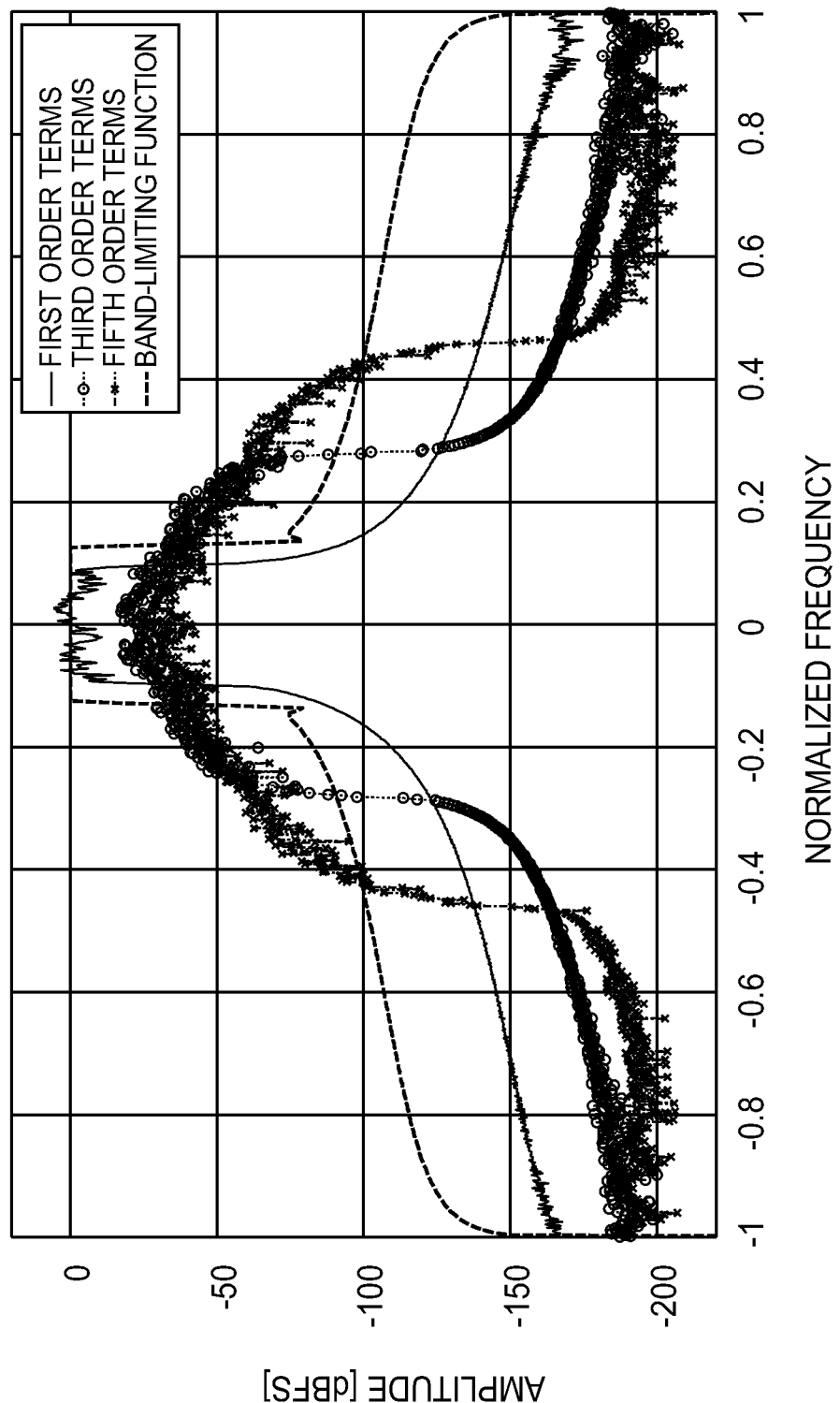
FIG. 6 illustrates the simulation results of FIG. 5 along with a desired band-limiting function of the band-limited observation receiver of FIG. 4 according to one embodiment of the present disclosure.
Figure 7:
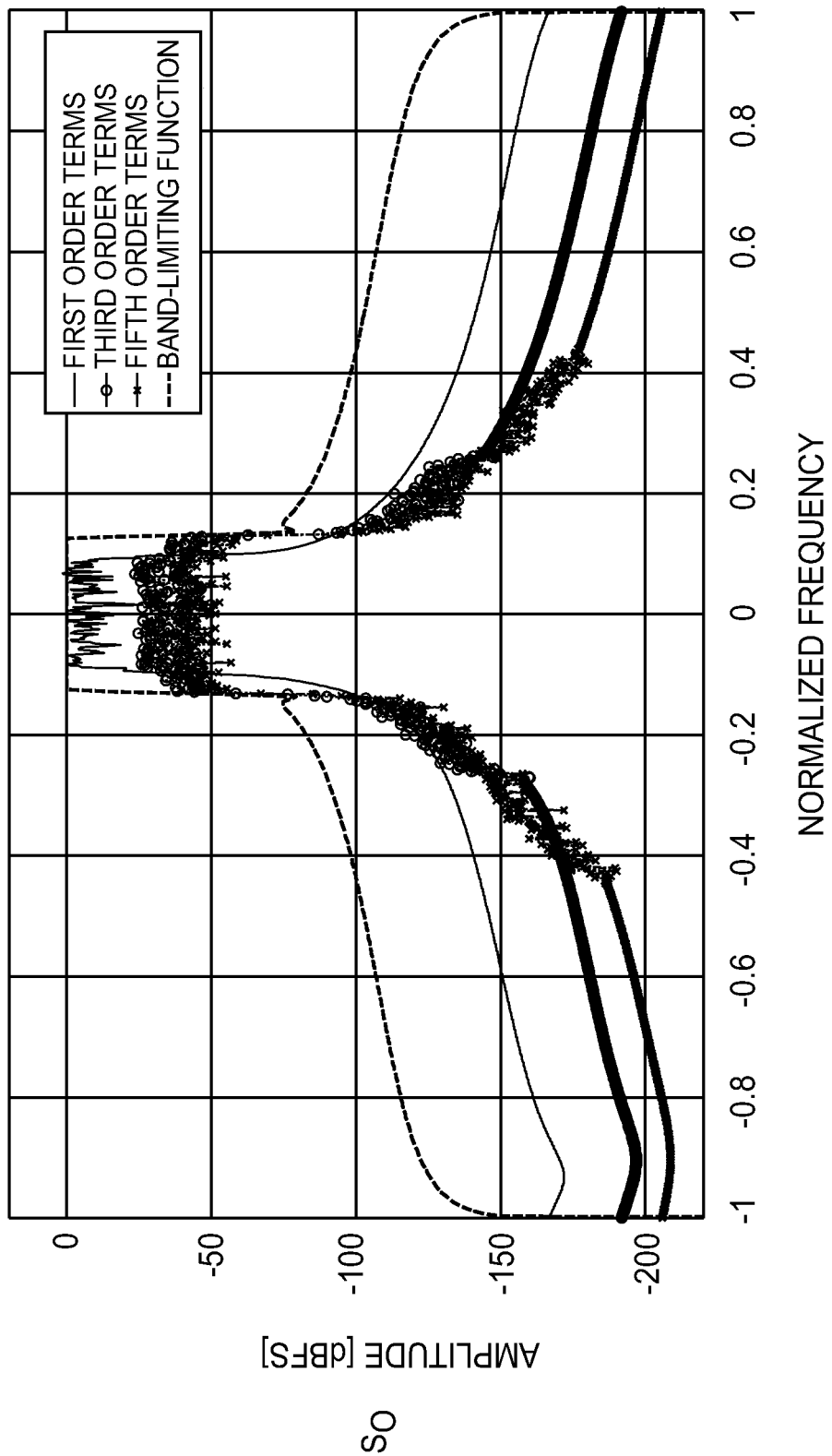
FIG. 7 illustrates simulation results similar to those of FIG. 5 that serve as an example of the contribution from different non-linear terms after filtering by the narrowband filter of the band-limited observation receiver of FIG. 4 according to one embodiment of the present disclosure.

FIGS. 5 through 7 are simulation results that graphically illustrate the band-limiting function of one exemplary implementation of the band-limited observation receiver 52 of FIG. 4. More specifically, FIG. 5 is a frequency-domain graph of simulation results that illustrates the contribution of different non-linear terms to the power amplifier output signal. As illustrated, the amplitudes of the third-order and fifth-order terms are smaller than that of the first-order term by orders of magnitude. Also, the amplitudes of the third-order and fifth-order terms diminish as frequency moves away from the carrier frequency. From FIG. 5, the inventors have found that the non-linear terms are well represented in-band (i.e., in the desired frequency band of the power amplifier output signal). Also, the contribution from the higher-order terms is much more significant in-band and around the desired carrier frequency of the power amplifier output signal and diminishes as frequency moves away from the desired carrier frequency. As such, contributions of the non-linear terms outside of the desired frequency band of the power amplifier output signal can be removed by the band-limiting function of the band-limited observation receiver 52 while still achieving desired performance. In this regard, FIG. 6 illustrates the band-limiting function of the band-limited observation receiver 52, and FIG. 7 illustrates the contribution of different non-linear terms after application of the band-limiting function of FIG. 6 (e.g., after passing through the narrowband filter 66).

Figure 8:
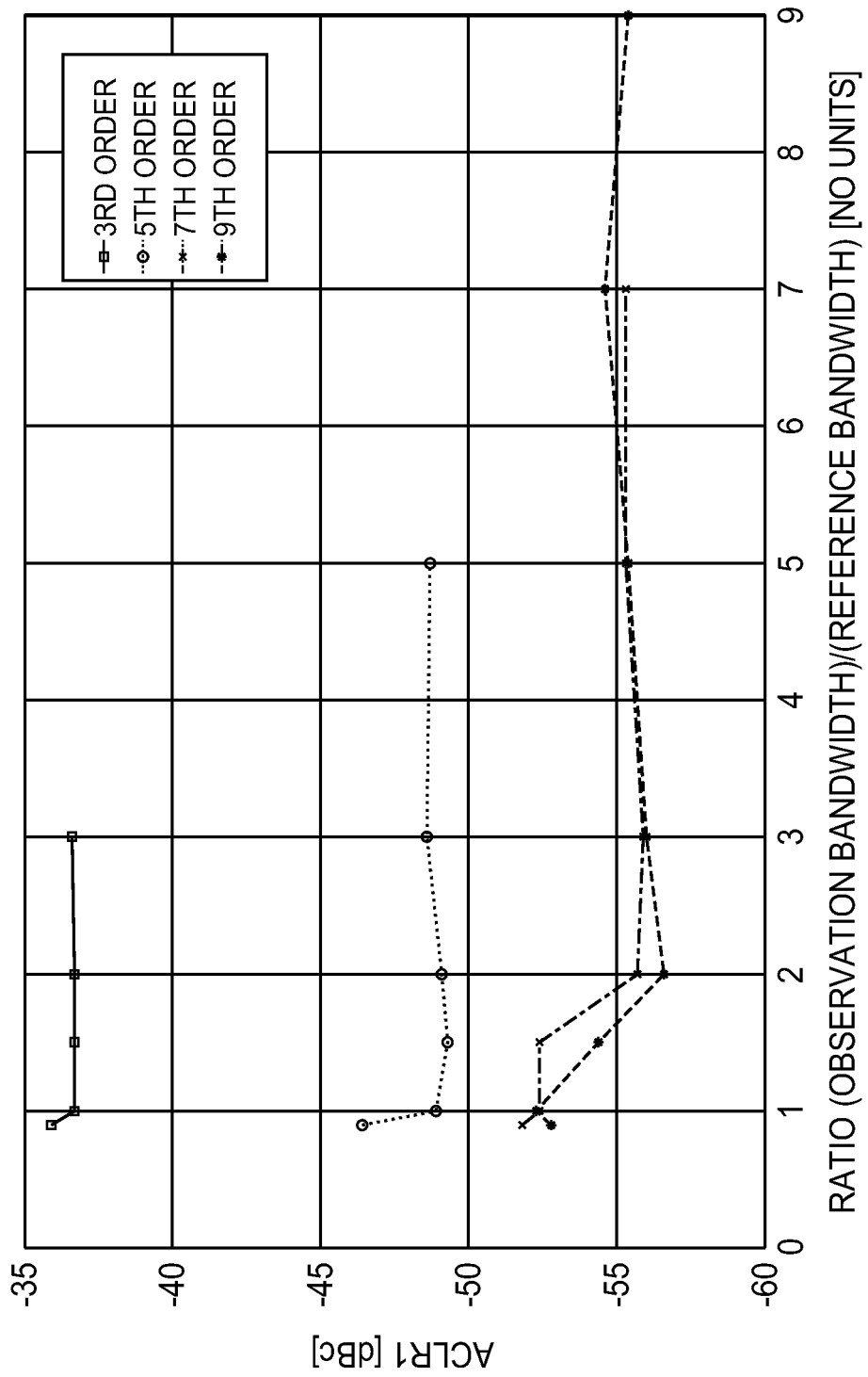
FIG. 8 illustrates results of a simulation of Adjacent Channel Leakage Ratio (ACLR1) versus a ratio of a bandwidth of the observation signal over a bandwidth of the reference signal for one embodiment of the transmitter of FIG. 4.
Figure 9:
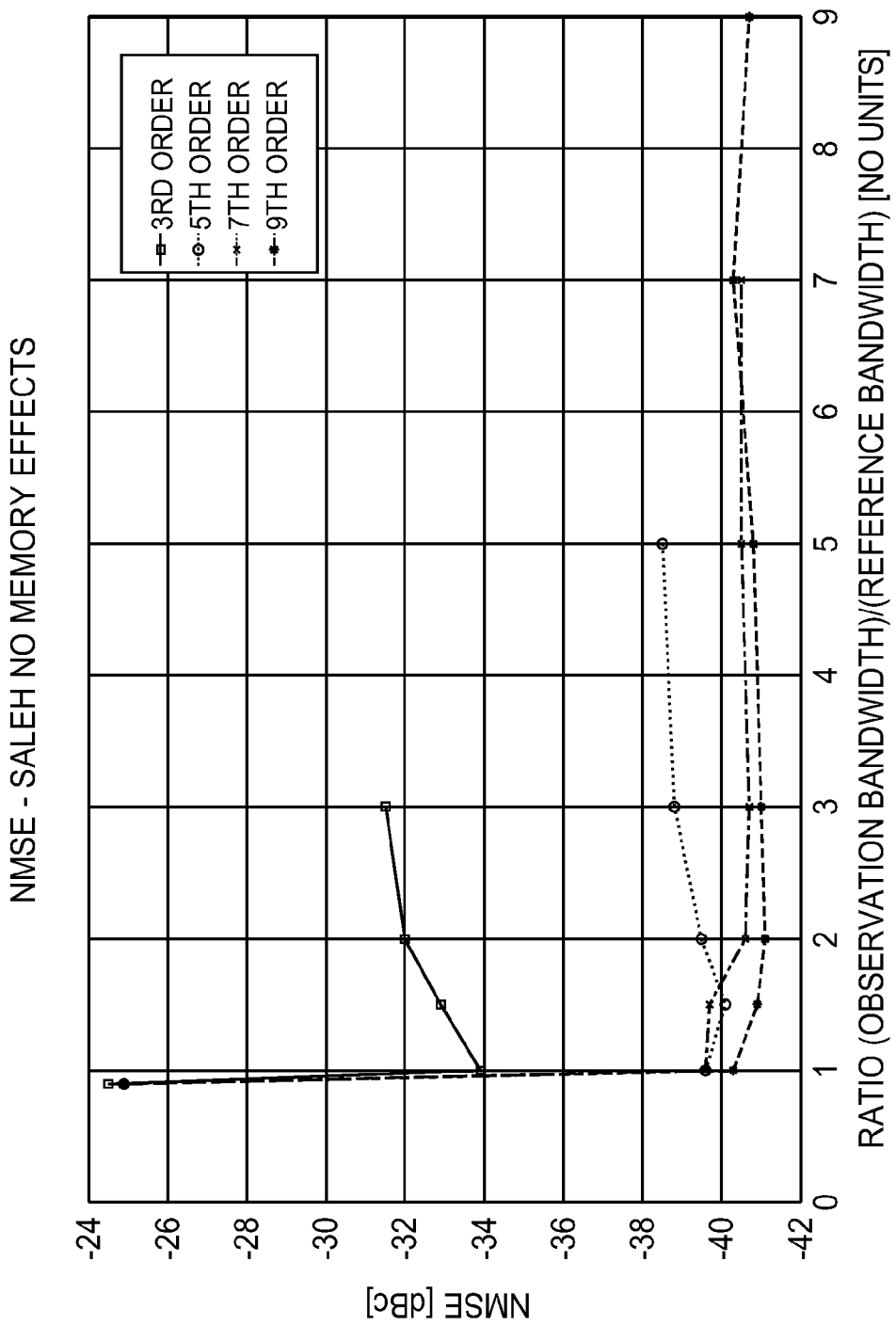
FIG. 9 illustrates results of a simulation of Normalized Mean Square Error (NMSE) versus a ratio of a bandwidth of the observation signal over a bandwidth of the reference signal for one embodiment of the transmitter of FIG. 4.

FIGS. 8 and 9 illustrate simulation results for Adjacent Channel Leakage Ratio (ACLR1) and Normalized Mean Square Error (NMSE) versus a ratio of the observation bandwidth of the band-limited observation receiver 52 over the bandwidth of the reference signal for third, fifth, seventh, and ninth-order predistortion by the predistorter 48 according to one exemplary implementation of the system 42 of FIG. 4. Note that the ratio of the observation bandwidth over the bandwidth of the reference signal is referred to herein as a band-limiting ratio. For the simulations, a single band 40 MHz Wideband Code Division Multiple Access (WCDMA) signal having a Peak-to-Average Power Ratio (PAPR) of 7.1 decibels (dB) was used along with a memoryless Saleh model for the power amplifier 46. The values shown in FIGS. 8 and 9 correspond to the average over 270 iterations. FIGS. 8 and 9 illustrate that a band-limiting ratio of 1.5 is appropriate for third-order and fifth-order predistortion. However, FIG. 8 shows an inflection point at a band-limiting ratio of 2 for seventh-order and ninth-order predistortion. Therefore, it is preferable that a band-limiting ratio of 2 be used for seventh-order and ninth-order predistortion in order to avoid performance degradation. Note, however, that a band-limiting ratio of 2 is a significant improvement for seventh-order and ninth-order predistortion, which would normally require the observation receiver 26 to support seven to nine times the bandwidth of the reference signal.

Figure 10:
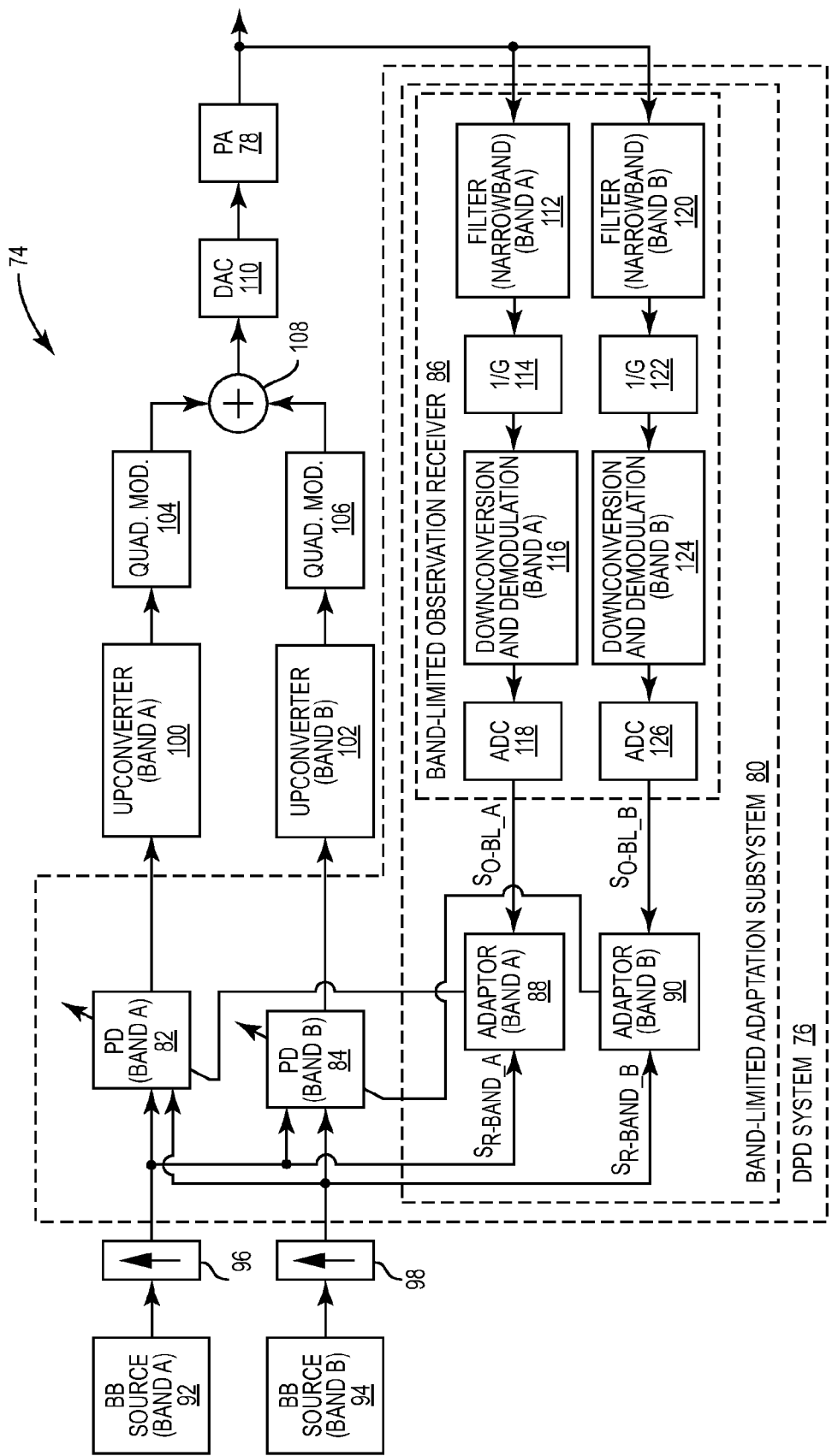
FIG. 10 illustrates a concurrent dual-band transmitter including a digital predistortion system that compensates for non-linearities of a power amplifier of the concurrent dual-band transmitter wherein the digital predistortion system includes a band-limited adaptation subsystem according to one embodiment of the present disclosure.

Thus far, the discussion has focused on the single-band signal scenario. However, in some implementations, a concurrent multi-band signal is desired. As used herein, a "concurrent multi-band signal" is a signal that contains frequency components occupying multiple frequency bands (i.e., a first continuous frequency band, a second continuous frequency band, etc.) with no frequency components between adjacent frequency bands. A concurrent multi-band signal having two frequency bands is referred to herein as a concurrent dual-band signal. In this regard, FIG. 10 illustrates a system 74 that includes a digital predistortion system 76 that compensates for non-linearities of a power amplifier 78 when amplifying a concurrent dual-band signal, where the digital predistortion system 76 includes a band-limited adaptation subsystem 80 according to one embodiment of the present disclosure. The two frequency bands of the concurrent dual-band signal are referred to herein as frequency bands A and B. Note, however, that the system 74 can easily be extended for concurrent multi-band signals having more than two frequency bands.

As illustrated, the digital predistortion system 76 includes separate predistorters 82 and 84 for the two frequency bands of the concurrent dual-band signal and the band-limited adaptation subsystem 80. The band-limited adaptation subsystem 80 includes a band-limited observation receiver 86 that includes separate band-limiting functions for the two frequency bands of the concurrent dual-band signal and separate adaptors 88 and 90 for the two frequency bands of the concurrent dual-band signal arranged as shown. As discussed below in detail, the band-limited observation receiver 86 includes a band-limiting function for frequency band A of the concurrent dual-band signal such that a bandwidth observed by the band-limited observation receiver 86 for frequency band A, and thus the bandwidth supported by the band-limited adaptation subsystem 80 for frequency band A, is less than $N_{MAX\_ORDER}$ times a bandwidth of an input signal to the predistorters 82 and 84 for frequency band A, where $N_{MAX\_ORDER}$ is a maximum order of non-linearity of the power amplifier 78 for which the digital predistortion system 76 is designed to compensate. Notably, the bandwidth of the input signal to the predistorters 82 and 84 for frequency band A is also a desired bandwidth of a power amplifier output signal output by the power amplifier 78 for frequency band A. In one preferred embodiment, the bandwidth observed by the band-limited observation receiver 86 for frequency band A is in a range of and including 1.5 to 2 times the bandwidth of the input signal to the predistorters 82 and 84 for frequency band A (i.e., the bandwidth of reference signal ($S_{R\text{-}BAND\_A}$)).

Likewise, the band-limited observation receiver 86 includes a band-limiting function for frequency band B of the concurrent dual-band signal such that a bandwidth observed by the band-limited observation receiver 86 for frequency band B, and thus a bandwidth supported by the band-limited adaptation subsystem 80 for frequency band B, is less than $N_{MAX\_ORDER}$ times a bandwidth an input signal to the predistorters 82 and 84 for frequency band B. Notably, the bandwidth of the input signal to the predistorters 82 and 84 for frequency band B is also a desired bandwidth of the power amplifier output signal output by the power amplifier 78 for frequency band B. In one preferred embodiment, the bandwidth observed by the band-limited observation receiver 86 for frequency band B is in a range of and including 1.5 to 2 times the bandwidth of the input signal to the predistorters 82 and 84 for frequency band B (i.e., the bandwidth of reference signal ($S_{R\text{-}BAND\_B}$)).

In operation, a baseband source 92 generates a baseband input signal for frequency band A of the concurrent dual-band signal, and a baseband source 94 generates a baseband input signal for frequency band B of the concurrent dual-band signal. The baseband input signals from the baseband sources 92 and 94 are up-sampled to desired sampling rates by up-sampling circuitry 96 and up-sampling circuitry 98, respectively. In order to accommodate frequency expansion resulting from predistortion introduced by the predistorter 82 and the non-linearity of the power amplifier 78, the desired sampling rate for the up-sampled baseband input signal for frequency band A would be greater than $N_{MAX\_ORDER} \times B_A$, where $B_A$ is a bandwidth of the baseband input signal for frequency band A and thus a bandwidth of the reference signal ($S_{R\text{-}BAND\_A}$) and a desired bandwidth for frequency band A in the power amplifier output signal output by the power amplifier 78. Likewise, in order to accommodate frequency expansion resulting from predistortion introduced by the predistorter 84 and the non-linearity of the power amplifier 78, the desired sampling rate for the up-sampled baseband input signal for frequency band B would be greater than $N_{MAX\_ORDER} \times B_B$, where $B_B$ is a bandwidth of the baseband input signal for frequency band B and thus a bandwidth of the reference signal ($S_{R\text{-}BAND\_B}$) and a desired bandwidth for frequency band B in the power amplifier output signal output by the power amplifier 78.

The predistorters 82 and 84 generate predistorted baseband input signals for frequency bands A and B, respectively. The predistortion introduced by the predistorters 82 and 84 compensates for up to the maximum order of non-linearity of the power amplifier 78 for which the digital predistortion system 76 is designed to compensate ($N_{MAX\_ORDER}$). The maximum order of non-linearity of the power amplifier 78 for which the digital predistortion system 76 is designed to compensate is at least the third-order. In one preferred embodiment, the maximum order of non-linearity of the power amplifier 78 for which the digital predistortion system 76 is designed to compensate is the fifth-order.

The predistorted baseband input signals are then upconverted and quadrature modulated by corresponding upconverters 100 and 102 and quadrature modulators 104 and 106, respectively. The resulting upconverted, modulated, and predistorted input signals are then combined by combiner circuitry 108 to provide a combined predistorted input signal, which is then converted from digital to analog by a DAC 110 to thereby provide a power amplifier input signal. Notably, while the DAC 110 is between the combiner circuitry 108 and the power amplifier 78 in this embodiment, the location of the DAC 110 can vary depending on the particular implementation. The power amplifier 78 amplifies the power amplifier input signal to provide the power amplifier output signal. The power amplifier output signal is the concurrent dual-band signal having frequency bands A and B.

The power amplifier output signal is fed back into the band-limited observation receiver 86. As discussed below, the band-limited adaptation subsystem 80, and in particular the band-limited observation receiver 86, introduces band-limiting functions for frequency bands A and B that significantly reduce an observation bandwidth of the band-limited observation receiver 86 for both frequency bands A and B and thus a sampling rate requirement of the adaptors 88 and 90. Specifically, the bandwidth observed by the band-limited observation receiver 86 for frequency band A is denoted as $B_{LIMITED\_A}$. The bandwidth ($B_{LIMITED\_A}$) observed by the band-limited observation receiver 86 for frequency band A is less than $N_{MAX\_ORDER} \times B_A$ and, in one preferred embodiment, is in a range of and including 1.5 to 2 times $B_A$. Since $B_{LIMITED\_A}$ is less than $N_{MAX\_ORDER} \times B_A$, the sampling rate requirement for the adaptor 88 is reduced from greater than $N_{MAX\_ORDER} \times B_A$ for the conventional digital predistortion system 10 (FIG. 1) to greater than $B_{LIMITED\_A}$. For example, for fifth-order predistortion and a bandwidth ($B_A$) of 40 MHz, the sampling rate requirement for the adaptor 88 is reduced from 200 MHz to less than 200 MHz and, in one preferred embodiment, 60 MHz to 80 MHz.

Likewise, the bandwidth observed by the band-limited observation receiver 86 for frequency band B is denoted as $B_{LIMITED\_B}$. The bandwidth ($B_{LIMITED\_B}$) observed by the band-limited observation receiver 86 for frequency band B is less than $N_{MAX\_ORDER} \times B_B$ and, in one preferred embodiment, is in a range of and including 1.5 to 2 times $B_B$. Since $B_{LIMITED\_B}$ is less than $N_{MAX\_ORDER} \times B_B$, the sampling rate requirement for the adaptor 90 is reduced from greater than $N_{MAX\_ORDER} \times B_B$ for the conventional digital predistortion system 10 (FIG. 1) to greater than $B_{LIMITED\_B}$. For example, for fifth-order predistortion and a bandwidth ($B_B$) of 40 MHz, the sampling rate requirement for the adaptor 90 is reduced from 200 MHz to less than 200 MHz and, in one preferred embodiment, 60 MHz to 80 MHz.

Figure 1:
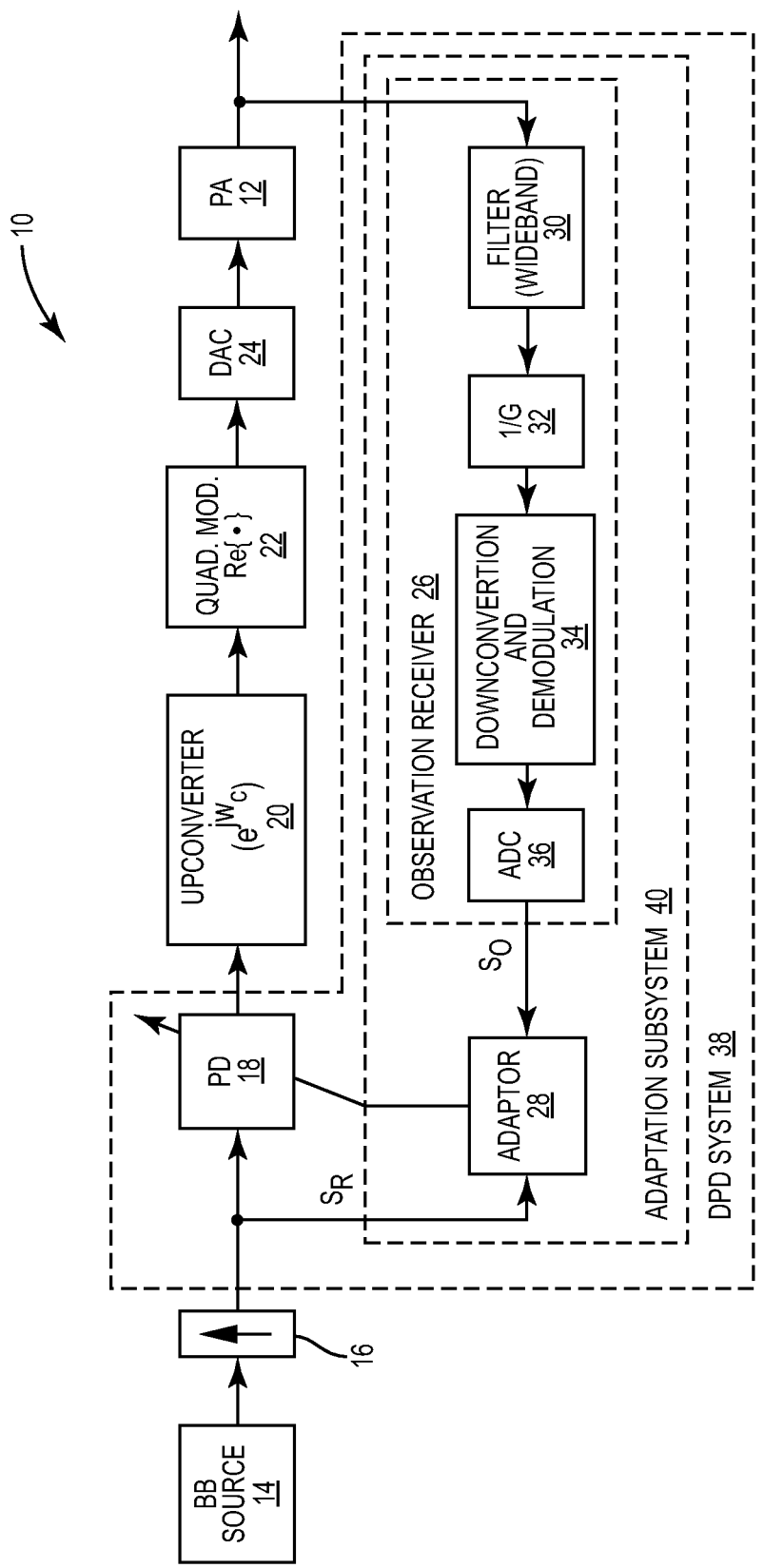
FIG. 1 illustrates a single-band transmitter including a conventional digital predistortion system.
Figure 2:
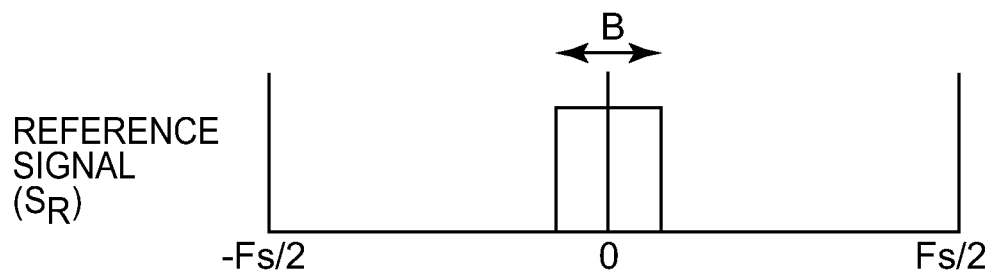
FIG. 2 illustrates a frequency domain representation of the reference signal input into the adaptor of the conventional digital predistortion system of FIG. 1.
Figure 3:
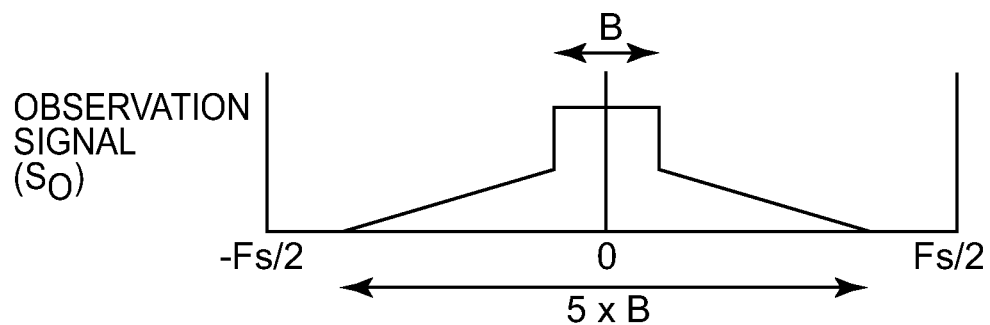
FIG. 3 illustrates a frequency domain representation of the observation signal input into the adaptor of the conventional digital predistortion system of FIG. 1 where non-linearities of the power amplifier have resulted in bandwidth expansion in the observation signal.

As illustrated, the band-limited observation receiver 86 includes a separate observation path for each of the frequency bands A and B of the power amplifier output signal. The observation path for frequency band A includes a narrowband filter 112, an attenuator 114, downconversion and demodulation circuitry 116, and an ADC 118 arranged as shown. The output of the band-limited observation receiver 86 for frequency band A is referred to herein as a band-limited observation signal ($S_{O\text{-}BL\_A}$) for frequency band A. In this embodiment, the narrowband filter 112 serves as a band-limiting function of the band-limited observation receiver 86 for frequency band A. The narrowband filter 112 has a pass-band that includes frequency band A of the power amplifier output signal (e.g., centered at the carrier frequency for frequency band A), and a bandwidth of the pass-band of the narrowband filter 112 is less than $N_{MAX\_ORDER}$ times the desired bandwidth of frequency band A of the power amplifier output signal (i.e., less than $N_{MAX\_ORDER} \times B_A$). In one preferred embodiment, the bandwidth of the pass-band of the narrowband filter 112 is in a range of and including 1.5 to 2 times the desired bandwidth of frequency band A of the power amplifier output signal, where $N_{MAX\_ORDER}$ is greater than or equal to 3 or more and preferably greater than or equal to 5. As a result of the narrowband filter 112, a bandwidth of the band-limited observation signal ($S_{O\text{-}BL\_A}$) for frequency band A is significantly less than what it would otherwise be if using the conventional adaptation approach (FIG. 1). This, in turn, allows the adaptor 88 and the ADC 118 to run at significantly lower sampling rates.

Likewise, the observation path for frequency band B includes a narrowband filter 120, an attenuator 122, downconversion and demodulation circuitry 124, and an ADC 126 arranged as shown. The output of the band-limited observation receiver 86 for frequency band B is referred to herein as a band-limited observation signal ($S_{O\text{-}BL\_B}$) for frequency band B. In this embodiment, the narrowband filter 120 serves as a band-limiting function of the band-limited observation receiver 86 for frequency band B. The narrowband filter 120 has a pass-band that includes frequency band B of the power amplifier output signal (e.g., centered at the carrier frequency for frequency band B), and a bandwidth of the pass-band of the narrowband filter 120 is less than $N_{MAX\_ORDER}$ times the desired bandwidth of frequency band B of the power amplifier output signal (i.e., less than $N_{MAX\_ORDER} \times B_B$). In one preferred embodiment, the bandwidth of the pass-band of the narrowband filter 120 is in a range of and including 1.5 to 2 times the desired bandwidth of frequency band B of the power amplifier output signal, where $N_{MAX\_ORDER}$ is greater than or equal to 3 or more and preferably greater than or equal to 5. As a result of the narrowband filter 120, a bandwidth of the band-limited observation signal ($S_{o\text{-}BL\_B}$) for frequency band B is significantly less than what it would otherwise be if using the conventional adaptation approach (FIG. 1). This, in turn, allows the adaptor 90 and the ADC 126 to run at significantly lower sampling rates.

The adaptor 88 adaptively configures the predistorter 82 based on a comparison of time-aligned as well as gain and phase adjusted versions of the band-limited observation signal ($S_{O\text{-}BL\_A}$) and the reference signal ($S_{R\text{-}BAND\_A}$), which in this case is the up-sampled baseband input signal input into the predistorters 82 and 84 for frequency band A. Specifically, the adaptor 88 configures one or more parameters of the predistorter 82 (e.g., one or more coefficients of a polynomial predistortion function) based on the comparison of the time-aligned as well as gain and phase adjusted versions of the band-limited observation signal ($S_{O\text{-}BL\_A}$) and the reference signal ($S_{R\text{-}BAND\_A}$) for frequency band A using any suitable adaptation technique. Likewise, the adaptor 90 adaptively configures the predistorter 84 based on a comparison of time-aligned as well as gain and phase adjusted versions of the band-limited observation signal ($S_{O\text{-}BL\_B}$) and the reference signal ($S_{R\text{-}BAND\_B}$), which in this case is the up-sampled baseband input signal that is input into the predistorters 82 and 84 for frequency band B. Specifically, the adaptor 90 configures one or more parameters of the predistorter 84 (e.g., one or more coefficients of a polynomial predistortion function) based on the comparison of the time-aligned as well as gain and phase adjusted versions of the band-limited observation signal ($S_{O\text{-}BL\_B}$) and the reference signal ($S_{R\text{-}BAND\_B}$) for frequency band B using any suitable adaptation technique.

Notably, while the narrowband filters 112 and 120 serve as the band-limiting functions of the band-limited observation receiver 86 in the embodiment of FIG. 10, the present disclosure is not limited thereto. For example, the band-limiting functions of the band-limited observation receiver 86 may alternatively be implemented at baseband (e.g., narrowband filters at baseband either before or after the ADCs 118 and 126). Further, while not essential for understanding the subject matter disclosed and claimed herein, for more information regarding the general operation of dual-band predistortion and adaptation of the separate predistorters 82 and 84, the interested reader is directed to Bassam et al., "2-D Digital Predistortion (2-D-DPD) Architecture for Concurrent Dual-Band Transmitters," *IEEE Transactions on Microwave Theory and Techniques*, Vol. 59, No. 10, pp. 2547-2553 (October 2011), which is hereby incorporated herein by reference for its teachings regarding dual-band digital predistortion.

Figure 11:
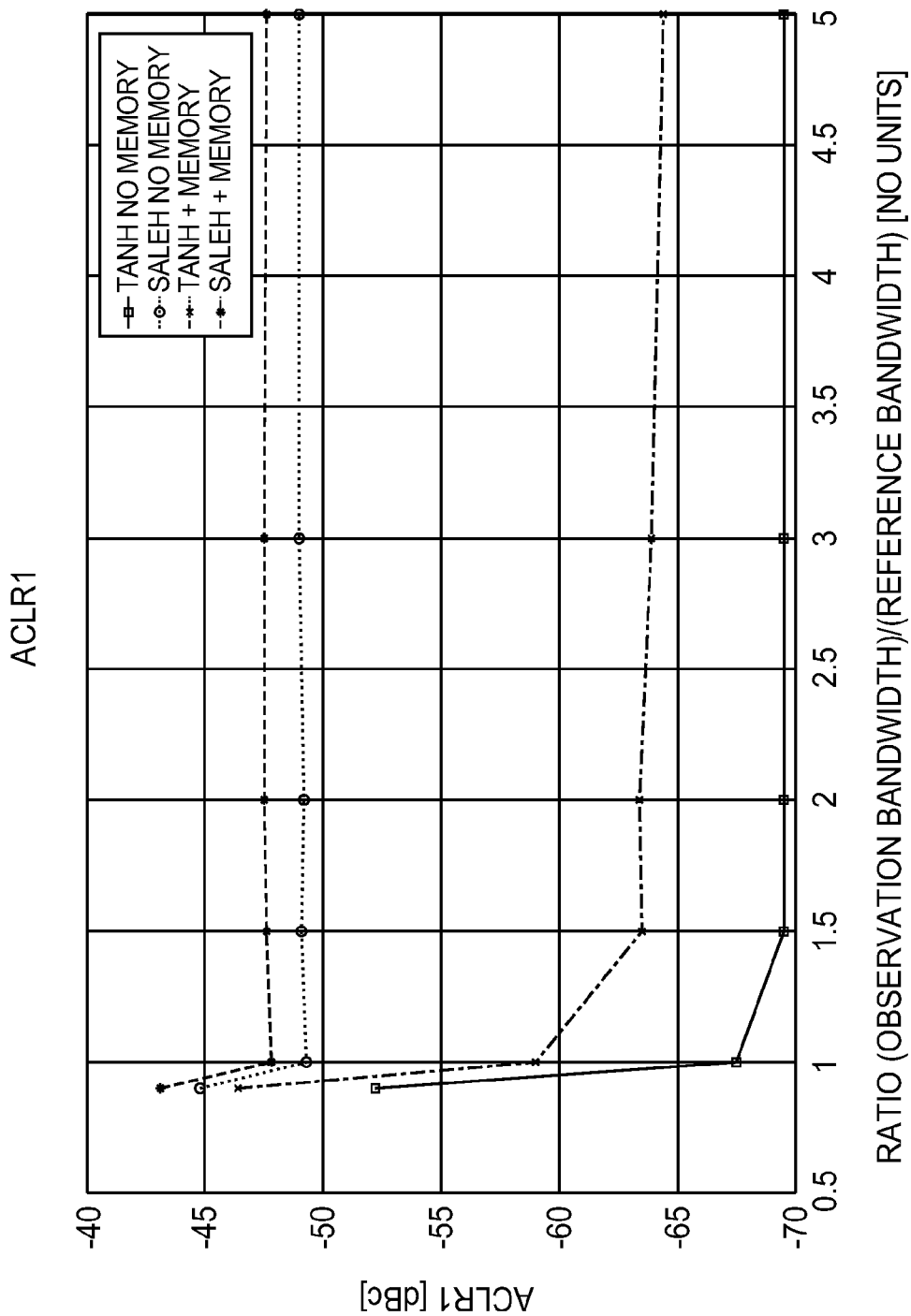
FIG. 11 illustrates results of a simulation of ACLR1 versus a ratio of a bandwidth of the observation signal over a bandwidth of the reference signal for a number of different power amplifier models for one embodiment of the concurrent dual-band transmitter of FIG. 10 that supports up to fifth-order non-linearities.
Figure 12:
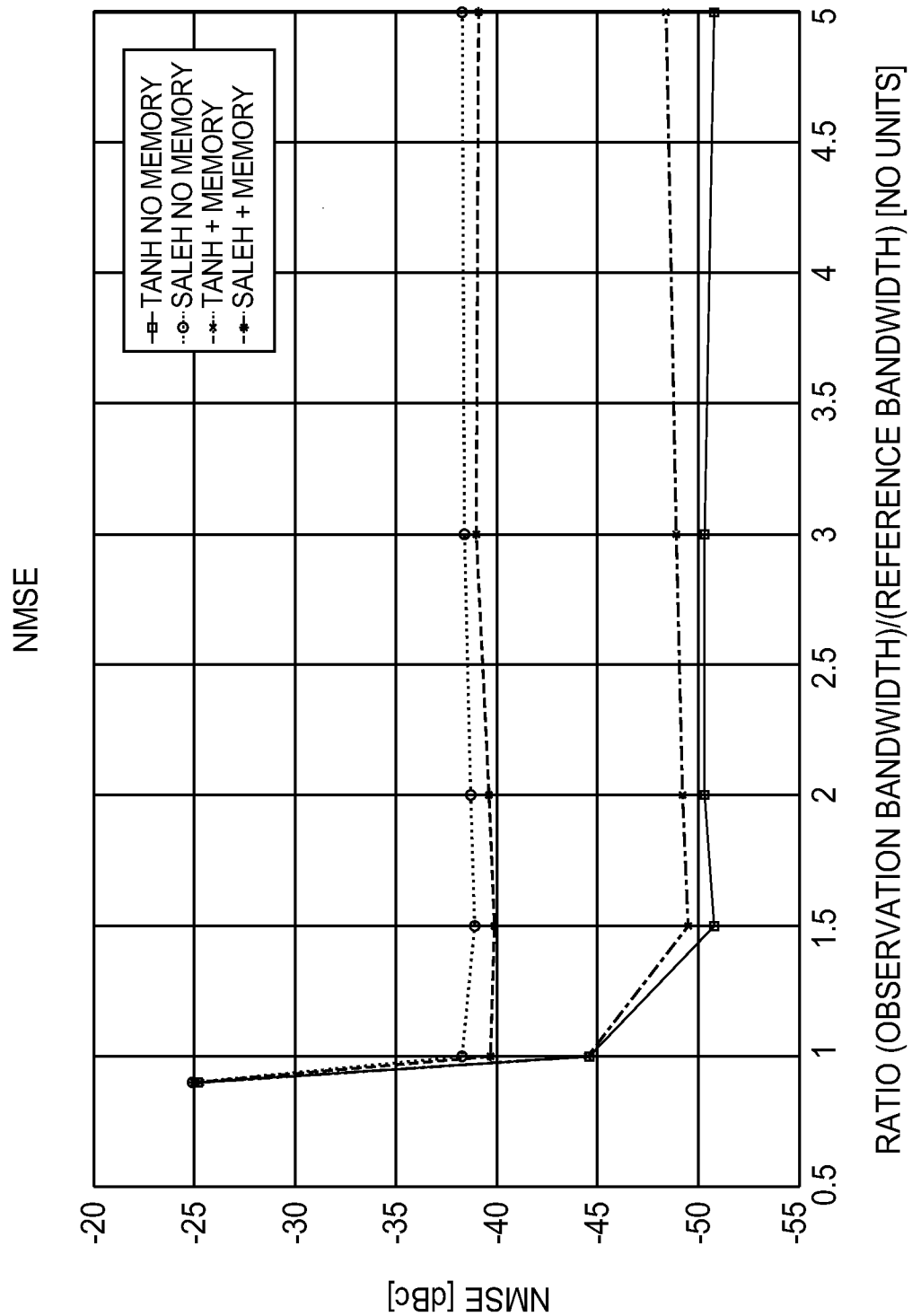
FIG. 12 illustrates results of a simulation of NMSE versus a ratio of a bandwidth of the observation signal over a bandwidth of the reference signal for a number of different power amplifier models for one embodiment of the concurrent dual-band transmitter of FIG. 10 that supports up to fifth-order non-linearities.

FIGS. 11 and 12 illustrate simulation results for ACLR1 and NMSE versus a ratio of the bandwidth of the band-limited observation signal over the bandwidth of the reference signal for fifth-order non-linearities of the power amplifier 78 when using different models for the power amplifier 78 according to one exemplary implementation of the system 74 of FIG. 10. For these simulations, a concurrent dual-band WCDMA signal with 2×40 MHz frequency bands separated by 500 MHz was used. The PAPR of the power amplifier input signal was 9.1 dB. The values illustrated in FIGS. 11 and 12 correspond to average values for the two frequency bands over 70 iterations. The four different models for the power amplifier 78 that were used for the simulations were: Hyperbolic tangent (tan h) without memory effects, Saleh model without memory effects, Hyperbolic tangent including memory effects, and Saleh model including memory effects.

The simulation results in FIGS. 11 and 12 show similar behavior between ACLR1 and NMSE metrics. All curves are relatively flat until they hit a band-limiting ratio of 1.5. At that point, the hyperbolic tangent model curves go through an inflection point, and the performances start to degrade quickly. When the band-limiting ratio is 1, the Saleh curves also experience an inflection point. Based on these observations, in one preferred embodiment, the band-limiting ratio is selected as 1.5. In other words, the bandwidth supported by the band-limited observation receiver 86 is selected as 1.5 times the bandwidth of the reference signals. In this example, the bandwidths of the two reference signals are the same.

Figure 13:
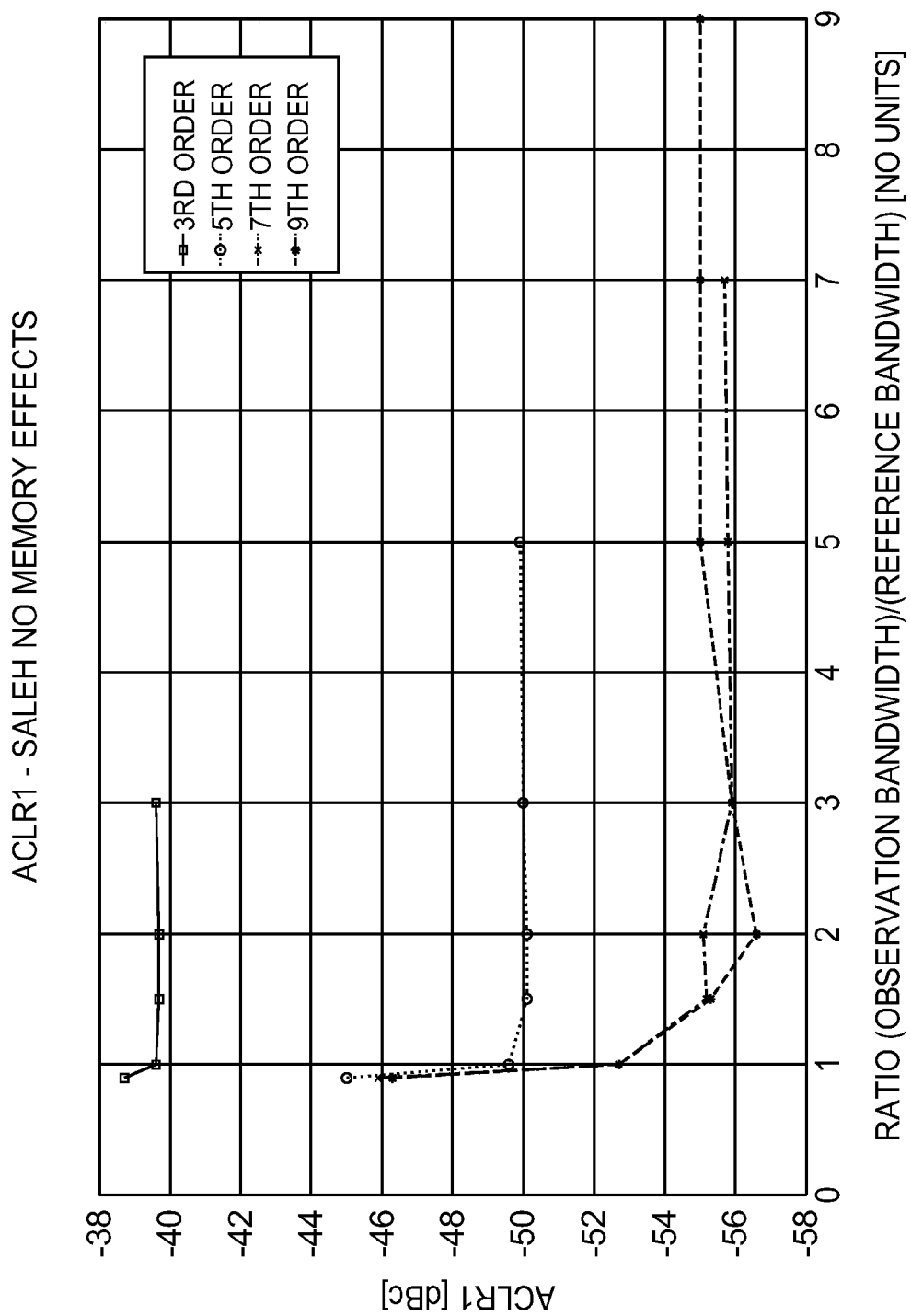
FIG. 13 illustrates results of a simulation of ACLR1 versus a ratio of a bandwidth of the observation signal over a bandwidth of the reference signal for one embodiment of the concurrent dual-band transmitter of FIG. 10 that utilizes a memoryless Saleh model for the power amplifier while varying the predistorter order.
Figure 14:
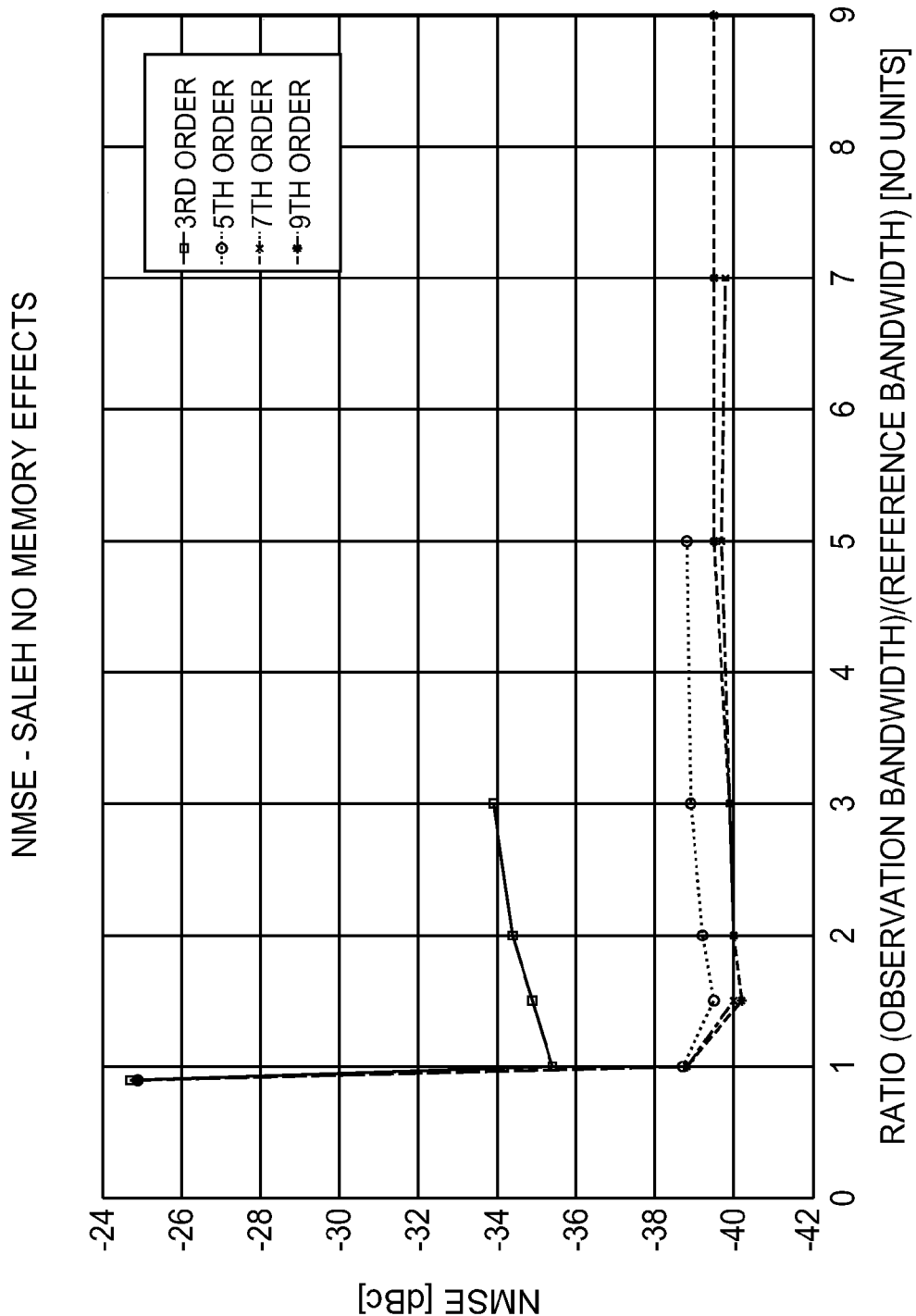
FIG. 14 illustrates results of a simulation of NMSE versus a ratio of a bandwidth of the observation signal over a bandwidth of the reference signal for one embodiment of the concurrent dual-band transmitter of FIG. 10 that utilizes a memoryless Saleh model for the power amplifier while varying the predistorter order.

FIGS. 13 and 14 illustrate simulation results for ACLR1 and NMSE versus a ratio of the bandwidth of the band-limited observation signal over the bandwidth of the reference signal for third, fifth, seventh, and ninth-order predistortion by the predistorters 82 and 84 according to one exemplary implementation of the system 74 of FIG. 10. For these simulations, a concurrent dual-band WCDMA signal with 2×40 MHz frequency bands separated by 500 MHz was used. The PAPR of the power amplifier input signal was 9.1 dB. The values illustrated in FIGS. 13 and 14 correspond to average values for the two frequency bands over 270 iterations. The memoryless Saleh model was used to model the power amplifier 78 because it is more challenging to linearize than the Hyperbolic tangent model.

The simulation results of FIGS. 13 and 14 show that the inflection points in the curves for the fifth and seventh-order non-linearities occur at a band-limiting ratio of 1.5. In the case of ninth-order non-linearities, the ACLR1 curve shows an inflection point at a band-limiting ratio of 2. However, it is important to note that on this curve, the ACLR1 for the band-limiting ratio of 1.5 is actually 0.3 dB better than that of the band-limiting ratio of 9. Therefore, the band-limiting ratio of 1.5 can be considered as the threshold. It is also interesting to note that the NMSE values for the fifth, seventh, and ninth-orders slightly improve around the band-limiting ratio of 1.5. This can be intuitively explained by the fact that most of the non-linearities in the observation paths have been removed by the band-limiting functions and, thus, the adaptors 88 and 90 can more easily track the reference signals. Finally, the curves for the third-order predistortion have their inflection points at a band-limited ratio of 1.

FIG. 15 illustrates a system 128 that includes a digital predistortion system 130 that compensates for non-linearities of a power amplifier 132 when amplifying a concurrent dual-band signal, where the digital predistortion system 130 includes a band-limited adaptation subsystem 134 according to another embodiment of the present disclosure. Again, the two frequency bands of the concurrent dual-band signal are referred to herein as frequency bands A and B. Note, however, that the system 128 can easily be extended for concurrent multi-band signals having more than two frequency bands.

As illustrated, the digital predistortion system 130 includes a combined predistorter 136 (hereinafter "predistorter 136") for the two frequency bands A and B of the concurrent dual-band signal and the band-limited adaptation subsystem 134. The band-limited adaptation subsystem 134 includes a band-limited observation receiver 138 that includes separate band-limiting functions for the two frequency bands of the concurrent dual-band signal and a combined adaptor 140 (hereinafter "adaptor 140") for the two frequency bands A and B of the concurrent dual-band signal arranged as shown. As discussed below in detail, the band-limited observation receiver 138 includes a band-limiting function for frequency band A of the concurrent dual-band signal such that a bandwidth observed by the band-limited observation receiver 138 for frequency band A is less than $N_{MAX\_ORDER}$ times a bandwidth of frequency band A in an input signal into the predistorter 136, where $N_{MAX\_ORDER}$ is a maximum order of non-linearity of the power amplifier 132 for which the digital predistortion system 130 is designed to compensate. In one preferred embodiment, the bandwidth observed by the band-limited observation receiver 138 for frequency band A is in a range of and including 1.5 to 2 times the bandwidth of frequency band A in the input signal input into the predistorter 136.

Likewise, the band-limited observation receiver 138 includes a band-limiting function for frequency band B of the concurrent dual-band signal such that a bandwidth observed by the band-limited observation receiver 138 for frequency band B is less than $N_{MAX\_ORDER}$ times a bandwidth of frequency band B in the input signal input into the predistorter 136, where $N_{MAX\_ORDER}$ is a maximum order of non-linearity of the power amplifier 132 for which the digital predistortion system 130 is designed to compensate. In one preferred embodiment, the bandwidth observed by the band-limited observation receiver 138 for frequency band B is in a range of and including 1.5 to 2 times the bandwidth of frequency band B in the input signal input into the predistorter 136.

In operation, a baseband source 142 generates a baseband input signal for frequency band A of the concurrent dual-band signal, and a baseband source 144 generates a baseband input signal for frequency band B of the concurrent dual-band signal. The baseband input signals from the baseband sources 142 and 144 are up-sampled to a desired sampling rate by up-sampling circuitry 146 and up-sampling circuitry 148, respectively. The up-sampled baseband input signals are then tuned to different predefined intermediate frequencies (IF1 and IF2) by tuning circuitry 150 and tuning circuitry 152, respectively. In one particular embodiment, IF1=−IF2. The tuned input signals are then combined by combiner circuitry 154 to provide a combined input signal. The combined input signal is predistorted by the predistorter 136. The predistortion introduced by the predistorter 136 compensates for up to the predefined maximum order of non-linearities of the power amplifier 132.

The predistorted input signal is then tuned, filtered, and upconverted to a desired carrier frequency for frequency band A by tuning circuitry 156, a filter 158, and an upconverter 160. Likewise, the predistorted signal is tuned, filtered, and up-converted to a desired carrier frequency for frequency band B by tuning circuitry 162, a filter 164, and an upconverter 166. The resulting upconverted signals are combined by combiner circuitry 168 to provide a combined radio frequency signal. The combined radio frequency signal is digital-to-analog converted by a DAC 170 to provide a power amplifier input signal, which is then amplified by the power amplifier 132 to provide the power amplifier output signal. The power amplifier output signal is a concurrent dual-band signal. Note that while the DAC 170 is located between the combiner circuitry 168 and the power amplifier 132 in this embodiment, the location of the DAC 170 can vary depending on the particular implementation.

The power amplifier output signal is fed back into the band-limited observation receiver 138. In the band-limited observation receiver 138, the power amplifier output signal is filtered by a wideband filter 172 to remove undesired frequency components and then attenuated by an attenuator 174. The filtered and attenuated power amplifier output signal is then passed through separate observation paths for each of the frequency bands A and B of the power amplifier output signal. More specifically, for frequency band A, the filtered and attenuated power amplifier output signal is downconverted to baseband by a downconverter 176. The downconverted signal is then filtered by a narrowband filter 178 to thereby apply the band-limiting function for frequency band A. The narrow-band filter 178 has a bandwidth that is less than $N_{MAX\_ORDER}$ times the bandwidth of frequency band A in the input signal to the predistorter 136 (i.e., the combined reference signal input into the adaptor 140) and, in one preferred embodiment, has a bandwidth that is in a range of 1.5 to 2 times the bandwidth of frequency band A in the input signal to the predistorter 136. The filtered signal is then tuned to IF1 by tuning circuitry 180. Likewise, for frequency band B, the filtered and attenuated power amplifier output signal is downconverted to baseband by a downconverter 182. The downconverted signal is then filtered by a narrowband filter 184 to thereby apply the band-limiting function for frequency band B. The narrowband filter 184 has a bandwidth that is less than $N_{MAX\_ORDER}$ times the bandwidth of frequency band B in the input signal to the predistorter 136 (i.e., the combined reference signal input into the adaptor 140) and, in one preferred embodiment, has a bandwidth that is in a range of 1.5 to 2 times the bandwidth of frequency band B in the input signal to the predistorter 136. The filtered signal is then tuned to IF2 by tuning circuitry 186.

The tuned signals from the tuning circuitry 180 and 186 are combined by combiner circuitry 188 and the resulting signal is converted from analog to digital by an ADC 190 to thereby provide a band-limited combined observation signal ($S_{O\_COMB}$). The adaptor 140 adaptively configures the predistorter 136 based on a comparison of time-aligned as well as gain and phase adjusted versions of the band-limited combined observation signal ($S_{O\_COMB}$) and the reference signal ($S_R$), which in this case is the combined IF signal input into the predistorter 136. Specifically, the adaptor 140 configures one or more parameters of the predistorter 136 (e.g., one or more coefficients of a polynomial predistortion function) based on the comparison of the time-aligned as well as gain and phase adjusted versions of the band-limited combined observation signal ($S_{O\_COMB}$) and the reference signal ($S_R$) using any suitable adaptation technique.

Lastly, it should be noted that the desired sampling rate for the adaptor 140 is conventionally selected to be high enough to accommodate the frequency expansion resulting from the non-linearity of the power amplifier 132. Thus, conventionally, the desired sampling rate would have been greater than $N_{MAX\_ORDER} \times B_{IF-COMBINED}$, where $B_{IF-COMBINED}$ is the bandwidth of the combined signal input into the adaptor 140. However, as discussed above, the band-limited adaptation subsystem 134 introduces band-limiting functions for frequency bands A and B that significantly reduce the sampling rate requirements of the adaptor 140 and the ADC 190. Specifically, in this embodiment, the desired sampling rate for the adaptor 140 is greater than $B_{LIMITED\_COMBINED}$, where $B_{LIMITED\_COMBINED}$ is a combined bandwidth observed by the band-limited observation receiver 138. The combined bandwidth observed by the band-limited observation receiver 138 is the bandwidth of the band-limited combined observation signal output by the band-limited observation receiver 138. Due to the band-limiting functions of the band-limited observation receiver 138 for frequency bands A and B, the combined bandwidth observed by the band-limited observation receiver 138 is less than $N_{MAX\_ORDER} \times B_{IF-COMBINED}$. As such, the sampling rate requirement for the adaptor 140 is reduced.

While not essential, for more information regarding the general digital predistortion architecture of FIG. 15, the interested reader is directed to commonly owned and assigned U.S. patent application Ser. No. 13/249,319 entitled SYSTEMS AND METHODS FOR DIGITAL PREDISTORTION IN A DUAL BAND TRANSMITTER, filed on Sep. 30, 2011 as well Cidronali et al., "A New Approach for Concurrent Dual-Band IF Digital PreDistortion: System Design and Analysis," *Integrated Nonlinear Microwave and Millimetre-Wave Circuits*, pp. 127-130 (November 2008), both of which are hereby incorporated herein by reference for their teachings related to the digital predistortion architecture of FIG. 15.

Figure 16:
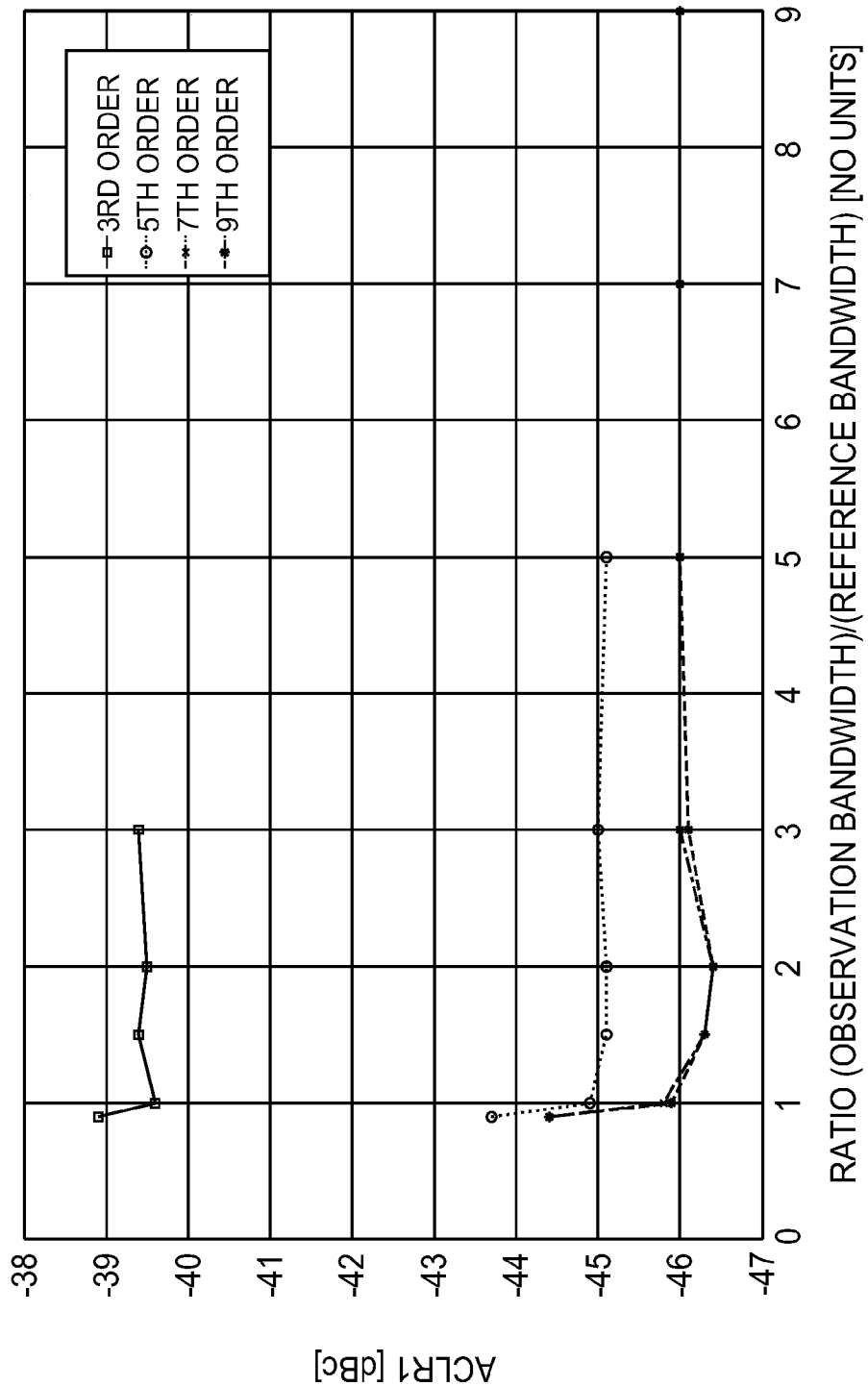
FIG. 16 illustrates results of a simulation of ACLR1 versus a ratio of a bandwidth of the observation signal over a bandwidth of the reference signal for one embodiment of the concurrent dual-band transmitter of FIG. 15.

FIGS. 16 and 17 illustrate simulation results for ACLR1 and NMSE versus a ratio of the bandwidth of the band-limited observation signal over the bandwidth of the reference signal for third, fifth, seventh, and ninth-order predistortion by the predistorter 136 according to one exemplary implementation of the system 128 of FIG. 15. For these simulations, a concurrent dual-band WCDMA signal with 2×40 MHz frequency bands separated by 500 MHz was used. The PAPR of the power amplifier input signal was 9.1 dB. The values illustrated in FIGS. 16 and 17 correspond to average values for the two frequency bands over 270 iterations. The memoryless Saleh model was used to model the power amplifier 132 because it is more challenging to linearize than the Hyperbolic tangent model. The curves in FIGS. 16 and 17 all have inflection points at a band-limiting ratio of 1.5 except for third-order predistortion. Note that for the sum digital predistortion approach of FIG. 15, the band-limiting ratio is the ratio of the observed bandwidth for frequency band A in the combined observation signal over the bandwidth of frequency band A in the reference signal or, conversely, the ratio of the observed bandwidth for frequency band B in the combined observation signal over the bandwidth of frequency band B in the reference signal.

FIG. 18 is a flow chart that illustrates a process for selecting a band-limiting ratio for a band-limited digital predistortion subsystem according to one embodiment of the present disclosure. First, a desired model for a power amplifier to be linearized by the band-limited digital predistortion subsystem is selected (step 1000). Preferably, the desired model is a model that most accurately reflects the operation of the power amplifier. Next, ACLR and/or NMSE values for at least one order of non-linearity of the power amplifier for different band-limited ratios are determined using the desired model for the power amplifier (step 1002). For instance, if the desired maximum order of non-linearities for which predistortion is desired is the fifth-order, then ACLR and/or NMSE values are determined for the fifth-order and, in some embodiments, the third-order using the desired model for the power amplifier. A band-limited ratio that corresponds to an inflection point(s) in the ACLR and/or NMSE values is selected a desired band-limited ratio (step 1004). The inflection point for the ACLR values corresponds to the band-limited ratio above which the ACLR values remain the same, or at least substantially the same. Likewise, the inflection point for the NMSE values corresponds to the band-limited ratio above with the NMSE values remain the same, or at least substantially the same.

The following acronyms are used throughout this disclosure.

ACLR1 Adjacent Channel Leakage Ratio
ADC Analog-to-Digital Converter
B Bandwidth
BB Baseband
DAC Digital-to-Analog Converter
dB Decibel
DPD Digital Predistorter
MHz Megahertz
NMSE Normalized Mean Square Error
PA Power Amplifier
PAPR Peak-to-Average Power Ratio
PD Predistorter
WCDMA Wideband Code Division Multiple Access Those skilled in the art will recognize improvements and modifications to the preferred embodiments of the present disclosure. All such improvements and modifications are considered within the scope of the concepts disclosed herein and the claims that follow.

What is claimed is:

1. A system comprising:
a power amplifier configured to amplify a power amplifier input signal to provide a power amplifier output signal wherein the power amplifier output signal is a concurrent multi-band signal having a plurality of frequency bands; and
a digital predistortion system configured to compensate for up to a predefined maximum order of non-linearity of the power amplifier and comprising a band-limited adaptation subsystem, wherein for each frequency band of the plurality of frequency bands of the power amplifier output signal, a bandwidth supported by the band-limited adaptation subsystem is greater than or equal to a desired bandwidth of the frequency band and less than $N_{MAX\_ORDER}$ times the desired bandwidth of the frequency band, wherein $N_{MAX\_ORDER}$ is a positive integer equal to the predefined maximum order of non-linearity of the power amplifier for which the digital predistortion system compensates.

2. The system of claim 1 wherein, for each frequency band of the plurality of frequency bands of the power amplifier output signal, the band-limited adaptation subsystem supports a bandwidth that is in a range of and including 1.5 to 2 times the desired bandwidth of the frequency band.

3. The system of claim 2 wherein the predefined maximum order of non-linearity of the power amplifier for which the digital predistortion system compensates is greater than or equal to the third-order.

4. The system of claim 2 wherein the predefined maximum order of non-linearity of the power amplifier for which the digital predistortion system compensates is greater than or equal to the fifth-order.

5. The system of claim 1 wherein:
the digital predistortion system further comprises a plurality of predistorters comprising a separate predistorter for each of a plurality of input signals, wherein each of the plurality of input signals is an input signal for a different one of the plurality of frequency bands of the power amplifier output signal; and
the band-limited adaptation subsystem comprises:
a band-limited observation receiver configured to receive and process the power amplifier output signal to provide a plurality of band-limited observation signals, wherein each band-limited observation signal of the plurality of band-limited observation signals is an observation signal for a corresponding one of the plurality of frequency bands of the power amplifier output signal and has a bandwidth that is less than $N_{MAX\_ORDER}$ times a desired bandwidth of the corresponding one of the plurality of frequency bands of the power amplifier output signal; and
a plurality of adaptors comprising a separate adaptor for each of the plurality of predistorters, each adaptor of the plurality of adaptors configured to adaptively control a corresponding one of the plurality of predistorters to compensate for up to the predefined maximum order of non-linearity of the power amplifier based on a reference signal for the corresponding one of the plurality of frequency bands of the power amplifier output signal and a corresponding one of the plurality of band-limited observation signals.

6. The system of claim 5 wherein, for each adaptor of the plurality of adaptors, the reference signal for the corresponding one of the plurality of frequency bands is a corresponding one of the plurality of input signals.

7. The system of claim 5 wherein the band-limited observation receiver comprises a separate band-limiting function for each of the plurality of frequency bands of the power amplifier output signal.

8. The system of claim 5 wherein the band-limited observation receiver comprises, for each frequency band of the plurality of frequency bands of the power amplifier output signal:
a narrowband filter that filters the power amplifier output signal to provide a filtered power amplifier output signal, wherein a pass-band of the narrowband filter comprises the frequency band and a bandwidth of the pass-band of the narrowband filter is less than $N_{MAX\_ORDER}$ times the desired bandwidth of the frequency band of the power amplifier output signal; and
circuitry configured to process the filtered power amplifier output signal to provide the band-limited observation signal.

9. The system of claim 8 wherein the bandwidth of the pass-band of the narrowband filter is in a range of and including 1.5 to 2 times the desired bandwidth of the frequency band of the power amplifier output signal.

10. The system of claim 9 wherein the predefined maximum order of non-linearity of the power amplifier for which the digital predistortion system compensates is greater than or equal to the third-order.

11. The system of claim 9 wherein the predefined maximum order of non-linearity of the power amplifier for which the digital predistortion system compensates is greater than or equal to the fifth-order.

12. The system of claim 5 wherein the plurality of predistorters provide a plurality of predistorted input signals, and the system further comprises circuitry configured to process the plurality of predistorted input signals to provide the power amplifier input signal.

13. The system of claim 1 wherein:
the digital predistortion system further comprises:
tuning circuitry configured to tune a plurality of input signals to a plurality of different intermediate frequencies to thereby provide a plurality of tuned input signals;
combining circuitry configured to combine the plurality of tuned input signals to provide a combined signal;
a predistorter configured to predistort the combined signal to provide a predistorted signal; and
circuitry configured to process the predistorted signal to provide the power amplifier input signal; and
the band-limited adaptation subsystem comprises:
a band-limited observation receiver configured to receive and process the power amplifier output signal to provide a combined band-limited observation signal having a plurality of frequency bands that correspond to the plurality of frequency bands of the power amplifier output signal, wherein for each frequency band of the plurality of frequency bands of the combined band-limited observation signal, the frequency band has a bandwidth that is less than $N_{MAX\_ORDER}$ times the desired bandwidth of the frequency band of the power amplifier output signal; and
an adaptor configured to adaptively control the predistorter to compensate for up to the predefined maximum order of non-linearity of the power amplifier based on the reference signal and the combined band-limited observation signal.

14. The system of claim 13 wherein the reference signal is the combined signal.

15. The system of claim 13 wherein the band-limited observation receiver comprises a separate band-limiting function for each of the plurality of frequency bands of the power amplifier output signal.

16. The system of claim 13 wherein the band-limited observation receiver comprises, for each frequency band of the plurality of frequency bands of the power amplifier output signal:
circuitry configured to process the power amplifier output signal to provide a separate observation signal for the frequency band, the circuitry comprising a narrowband filter wherein a bandwidth of a pass-band of the narrowband filter is less than $N_{MAX\_ORDER}$ times the desired bandwidth of the frequency band of the power amplifier output signal; and
combining circuitry configured to combine the separate observation signals for the plurality of frequency bands of the power amplifier output signal to provide the combined band-limited observation signal.

17. The system of claim 16 wherein the bandwidth of the pass-band of the narrowband filter is in a range of and including 1.5 to 2 times the desired bandwidth of the frequency band of the power amplifier output signal.

18. The system of claim 17 wherein the predefined maximum order of non-linearity of the power amplifier for which the digital predistortion system compensates is greater than or equal to the third-order.

19. The system of claim 17 wherein the predefined maximum order of non-linearity of the power amplifier for which the digital predistortion system compensates is greater than or equal to the fifth-order.

20. The system of claim 13 further comprising circuitry configured to process the predistorted signal to provide the power amplifier input signal.

21. A method of selecting a band-limited ratio for a band-limited adaptation subsystem of a digital predistortion system that compensates for non-linearities of a power amplifier, comprising:
 determining values for one or more performance parameters of the power amplifier for a plurality of band-limited ratios wherein for each performance parameter of the one or more performance parameters, the values for the performance parameter define a curve of the values for the performance parameter versus the plurality of band-limited ratios; and
 selecting one of the plurality of band-limited ratios that corresponds to an inflection point in the curve for each of the one or more performance parameters as the band-limited ratio for the band-limited adaptation subsystem.

* * * * *

UNITED STATES PATENT AND TRADEMARK OFFICE
CERTIFICATE OF CORRECTION

PATENT NO. : 8,890,609 B2  Page 1 of 1
APPLICATION NO. : 13/681976
DATED : November 18, 2014
INVENTOR(S) : Laporte It is certified that error appears in the above-identified patent and that said Letters Patent is hereby corrected as shown below:

In The Specification

In Column 1, Line 41, delete "$f_{NL-1M3}$" and insert -- $f_{NL-IM3}$ --, therefor.

Signed and Sealed this
Sixteenth Day of August, 2016

Michelle K. Lee
*Director of the United States Patent and Trademark Office*